(12) United States Patent
Rashid et al.

(10) Patent No.: US 11,552,627 B2
(45) Date of Patent: Jan. 10, 2023

(54) PWM CIRCUITRY

(71) Applicant: Cirrus Logic International Semiconductor Ltd., Edinburgh (GB)

(72) Inventors: Tahir Rashid, Tewkesbury (GB); Jonathan Taylor, London (GB); Ross C. Morgan, Bathgate (GB); Holger Haiplik, Swindon (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/226,843

(22) Filed: Apr. 9, 2021

(65) Prior Publication Data

US 2022/0038087 A1    Feb. 3, 2022

Related U.S. Application Data

(60) Provisional application No. 63/077,159, filed on Sep. 11, 2020, provisional application No. 63/059,504, filed on Jul. 31, 2020.

(51) Int. Cl.
*H03K 7/08*    (2006.01)
*H03M 1/12*    (2006.01)

(52) U.S. Cl.
CPC .......... *H03K 7/08* (2013.01); *H03M 1/12* (2013.01)

(58) Field of Classification Search
CPC ................................. H03K 7/08; H03M 1/12
USPC ........................................................ 327/172
See application file for complete search history.

(56) References Cited

U.S. PATENT DOCUMENTS

| | | | |
|---|---|---|---|
| 5,281,900 | A | 1/1994 | Park |
| 5,838,124 | A | 11/1998 | Hill |
| 5,856,736 | A | 1/1999 | Rotunda et al. |
| 6,100,654 | A | 8/2000 | Izukawa et al. |
| 8,324,845 | B2 | 12/2012 | Suzuki et al. |
| 9,893,632 | B2 | 2/2018 | Freeman et al. |
| 2006/0219471 | A1 | 10/2006 | Hayashi |
| 2009/0231052 | A1 | 9/2009 | Li |
| 2014/0210534 | A1 | 7/2014 | Wang et al. |
| 2015/0333676 | A1 | 11/2015 | Liu |
| 2017/0279393 | A1 | 9/2017 | Kawashima et al. |
| 2018/0123491 | A1 | 5/2018 | Jo et al. |
| 2020/0036352 | A1 | 1/2020 | Zhu et al. |
| 2022/0038111 | A1 | 2/2022 | Morgan et al. |

FOREIGN PATENT DOCUMENTS

| | | |
|---|---|---|
| CA | 2925348 A1 | 4/2015 |
| GB | 1505829 | 3/1978 |
| GB | 1577537 | 10/1980 |

(Continued)

OTHER PUBLICATIONS

Combined Search and Examination Report under Sections 17 and 18(3), UKIPO, Application No. GB2105789.8, dated Feb. 17, 2022.

(Continued)

*Primary Examiner* — Tomi Skibinski

(74) *Attorney, Agent, or Firm* — Jackson Walker L.L.P.

(57) ABSTRACT

The present disclosure relates to circuitry comprising: pulse-width modulation (PWM) circuitry configured to generate a PWM output signal; and monitoring circuitry configured to monitor a supply voltage to the PWM circuitry and to output a control signal for controlling operation of the PWM circuitry, wherein the control signal is based on the supply voltage.

27 Claims, 24 Drawing Sheets

(56) References Cited

FOREIGN PATENT DOCUMENTS

| GB | 2254941 | A | * | 10/1992 | ............ H02M 3/156 |
|----|---------|---|---|---------|------------------------|
| GB | 2254941 | A |   | 10/1992 |                        |
| GB | 2425903 | A |   | 11/2006 |                        |
| GB | 2519101 | A |   | 4/2015  |                        |
| WO | 8002346 | A1 |  | 10/1980 |                        |
| WO | 2008147108 | A1 | | 12/2008 |                      |
| WO | 2013111587 | A2 | | 8/2013  |                      |
| WO | 2015051248 | A1 | | 4/2015  |                      |

OTHER PUBLICATIONS

Combined Search and Examination Report under Sections 17 and 18(3), UKIPO, Application No. GB2102561.4, dated Aug. 17, 2021.
Search Report, Taiwan Intellectual Property Office, Application No. 110133754, dated Jun. 8, 2022.
International Search Report and Written Opinion of the International Searching Authority, International Application No. PCT/GB2021/052347, dated Apr. 4, 2022.
Combined Search and Examination Report, United Kingdom Intellectual Property Office, Application No. GB2243777.2, dated Oct. 6, 2022.

* cited by examiner

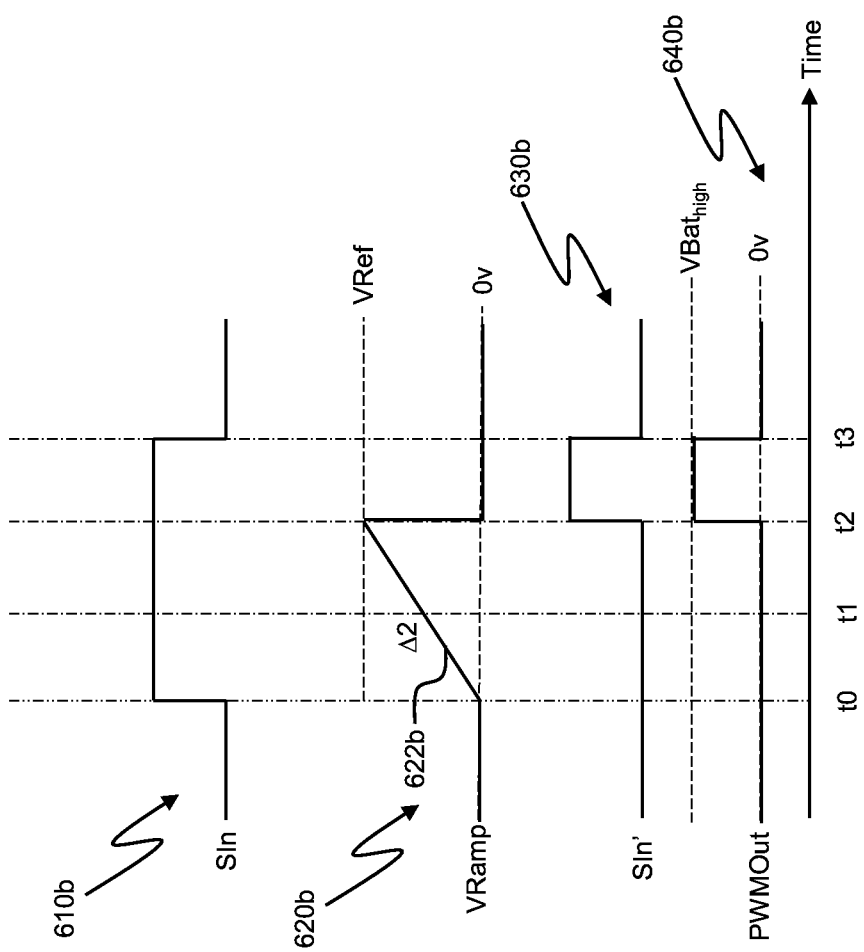

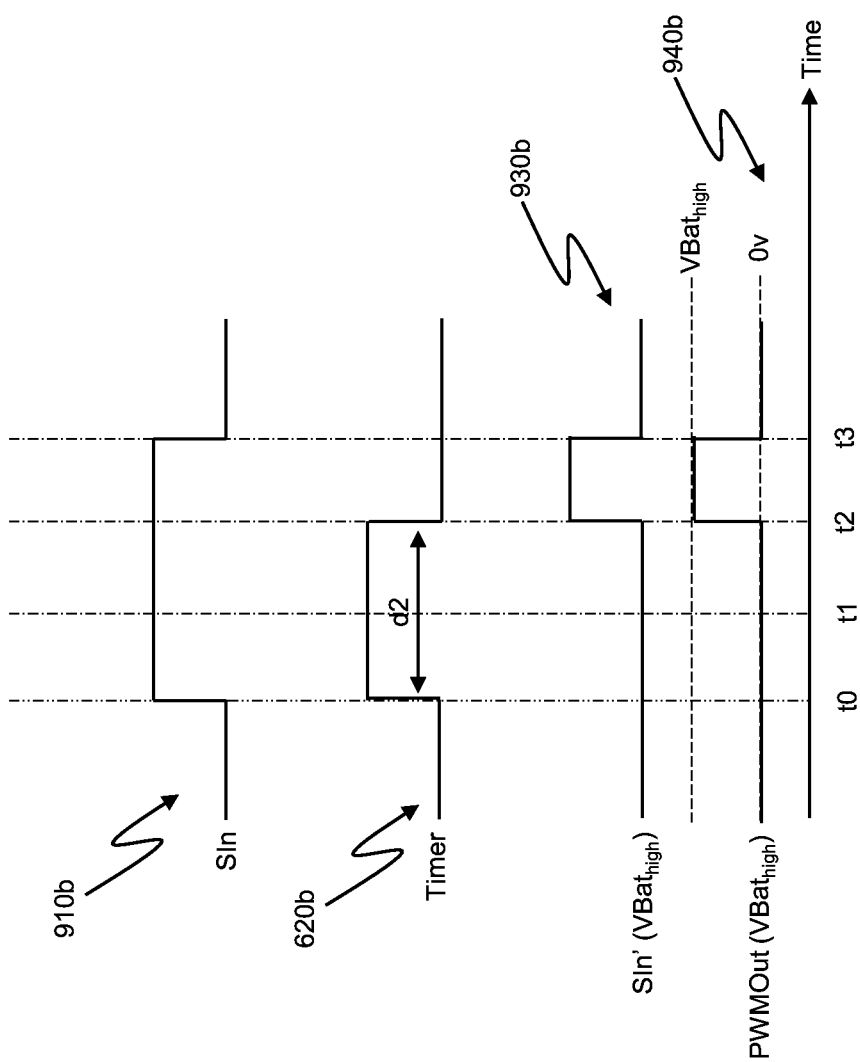

PWM CIRCUITRY

FIELD OF THE INVENTION

The present disclosure relates to pulse width modulation (PWM) circuitry, and in particular to PWM circuitry for controlling or driving a transducer and/or electronic circuitry.

BACKGROUND

One way of controlling the speed of a DC motor is to adjust a supply voltage applied to the motor. Thus, at higher supply voltages the speed of the motor is higher, whereas at lower supply voltages the speed of the motor is lower, in the absence of any load on the motor. However, controlling the speed in this way can limit the power and/or torque of the motor, and makes the speed of the motor sensitive to the load on the motor. Further, as the motor speed is dependent upon the supply voltage, any change in the supply voltage (e.g. a reduction in the supply voltage arising, for example, as a result of discharging of a battery that provides the supply voltage) will also affect the motor speed.

An alternative approach is to use a pulse width modulated (PWM) or pulse duration modulated (PDM) drive signal to control the speed of a DC motor. The speed of the motor is controlled by varying the duty cycle of a PWM drive signal output by PWM circuitry to the motor, such that the motor speed is effectively controlled by the RMS (root-mean squared) value of the PWM drive signal. In an open-loop system of motor control in which the supply voltage varies, e.g. where the supply voltage to the PWM circuitry is provided by a power source such as a battery for example, the speed is a function of both the duty cycle of the PWM drive signal and the supply voltage, since as the supply voltage changes the RMS value of the drive signal changes accordingly.

To mitigate the problem of the motor speed being dependent upon the supply voltage as well as the duty cycle of the PWM drive signal, the supply voltage to the PWM circuitry may be regulated by means of voltage regulator circuitry such as DC-DC converter circuitry, low drop-out (LDO) regulator circuitry or the like. However, the use of such additional voltage regulator circuitry increases, for example, the physical size, number of components and cost of a system for controlling a DC motor, and can also reduce the power efficiency of the system due to inefficiencies in the additional voltage regulator circuitry and necessary headroom requirements of the voltage regulator circuitry.

PWM drive signals can also be used to drive other transducers, such as LEDs (light emitting diodes), haptic transducers, resonant actuators and the like, and issues similar to those outlined above can arise when using PWM drive signals in such applications.

SUMMARY

According to a first aspect, the invention provides circuitry comprising:
  pulse-width modulation (PWM) circuitry configured to generate a PWM output signal; and
  monitoring circuitry configured to monitor a supply voltage to the PWM circuitry and to output a control signal for controlling operation of the PWM circuitry, wherein the control signal is based on the supply voltage.

The PWM circuitry may be operative to control a pulse width of a pulse of the PWM output signal based on the control signal.

The PWM circuitry may be operative to control a pulse width of a pulse of the PWM output signal based on the control signal to maintain a given average voltage per period of the PWM output signal to compensate, at least partially, for a change in a magnitude of the supply voltage.

The circuitry may be configured to increase the pulse width of the pulse of the PWM output signal to compensate, at least partially, for a decrease in the magnitude of the supply voltage.

The circuitry may be configured to decrease the pulse width of the pulse of the PWM output signal to compensate, at least partially, for an increase in the magnitude of the supply voltage.

The monitoring circuitry may be configured to receive an input signal for the PWM circuitry and to output a modified input signal to the PWM circuitry as the control signal, and wherein the PWM circuitry is configured to generate the PWM output signal based on the modified input signal.

The monitoring circuitry may comprise:
  waveform generator circuitry configured to generate a voltage having an amplitude that changes over time based on a magnitude of the supply voltage;
  comparator circuitry configured to compare the voltage to a reference voltage and to output a comparison signal when the voltage reaches the reference voltage; and
  logic circuitry configured to receive the input signal and the comparison signal and to generate a modified input signal for the PWM circuitry based on the input signal and the comparison signal.

The waveform generator circuitry may be configured such that a rate of increase of the voltage is inversely proportional to the magnitude of the supply voltage.

The waveform generator circuitry may be configured to generate a ramp voltage.

The monitoring circuitry may comprise:
  a capacitor;
  voltage-to-current converter circuitry configured to generate a first current based on the supply voltage;
  current generator circuitry configured to generate a constant current for charging the capacitor; and
  current mirror circuitry; and
a current control transistor, wherein the current mirror circuitry is configured to mirror the first current to a control terminal of the current control transistor, such that the current control transistor controls a portion of the constant current that is diverted away from the capacitor.

The monitoring may circuitry comprise:
  analogue-to-digital converter (ADC) circuitry configured to generate a digital output signal based on the supply voltage;
  timer circuitry configured to:
    receive the input signal and the digital output signal;
    commence timing a time period on detection of a feature of the input signal, wherein a duration of the time period is based on the digital output signal; and
    output a timer output signal at the end of the time period; and
  logic circuitry configured to receive the input signal and the timer output signal and to generate a modified input signal for the PWM circuitry based on the input signal and the timer output signal.

The timer circuitry may be configured such that the duration of the time period is inversely proportional to a magnitude of the supply voltage.

The feature of the input signal may be a rising edge of a pulse of the input signal.

The monitoring circuitry may comprise:
voltage controlled oscillator (VCO) circuitry configured to generate an oscillating output signal having a frequency that is based on the supply voltage;
counter circuitry configured to:
  receive the input signal and the oscillating output signal;
  commence a count of cycles of the oscillating signal on detection of a feature of the input signal; and
  output a counter output signal when the count reaches a count value that represents a magnitude of the supply voltage; and
logic circuitry configured to receive the input signal and the counter output signal and to generate a modified input signal for the PWM circuitry based on the input signal and the timer output signal.

The VCO circuitry may be configured such that the frequency of the oscillating output signal is inversely proportional to a magnitude of the supply voltage.

The feature of the input signal may be a rising edge of a pulse of the input signal.

The monitoring circuitry may comprise:
first waveform generator circuitry configured to generate a first voltage having an amplitude that changes over time based on a first fixed reference voltage;
second waveform generator circuitry configured to generate a second voltage having an amplitude that changes over time based on a magnitude of the supply voltage;
first comparator circuitry configured to compare the first voltage to a second reference voltage and to output a first comparison signal when the first voltage reaches the second reference voltage;
second comparator circuitry configured to compare the second voltage to the second reference voltage and to output a second comparison signal when the second voltage reaches the second reference voltage; and
logic circuitry configured to receive the first and second comparison signals and to generate a modified input signal for the PWM circuitry based on the first and second comparison signals.

The monitoring circuitry may comprise:
first timer circuitry configured to:
  receive the input signal and a reference signal;
  commence timing a first time period on detection of a feature of the input signal, wherein a duration of the time period is based on the reference signal; and
  output a first timer output signal at the end of the first time period;
analogue-to-digital converter (ADC) circuitry configured to generate a digital output signal based on the supply voltage;
second timer circuitry having a first input configured to receive an inverted version of the input signal and a second input coupled to an output of the ADC circuitry, the second timer circuitry configured to:
  commence timing a second time period on detection of signal feature of the inverted input signal, wherein a duration of the second time period is based on the digital output signal; and
  output a second timer output signal at the end of the second time period;
and
logic circuitry configured to receive the first and second timer output signals and to generate a modified input signal for the PWM circuitry based on the first and second timer output signals.

The monitoring circuitry may comprise:
first voltage controlled oscillator (VCO) circuitry configured to generate a first oscillating output signal having a frequency that is based on a reference voltage;
second voltage controlled oscillator (VCO) circuitry configured to generate a second oscillating output signal having a frequency that is based on the supply voltage;
first counter circuitry configured to:
  receive the input signal and the first oscillating output signal;
    commence a count of cycles of the first oscillating signal on detection of a feature of the input signal; and
    output a first counter output signal when the count reaches a reference count value;
  second counter circuitry configured to:
    receive an inverted version of the input signal and the second oscillating output signal;
    commence a count of cycles of the first oscillating signal on detection of signal feature of the inverted version of the input signal; and
    output a second counter output signal when the count reaches the reference count value; and
logic circuitry configured to receive the first and second counter outputs signal and to generate a modified input signal for the PWM circuitry based on the first and second counter output signals.

According to a second aspect, the invention provides integrated circuitry comprising the circuitry of the first aspect.

According to a third aspect, the invention provides a system comprising the circuitry of the first aspect and an output transducer configured to receive the PWM output signal from the PWM circuitry.

The output transducer may comprises one or more of a motor, a light emitting diode (LED) or LED array, a haptic actuator, a resonant actuator and/or a servo.

According to a fourth aspect, the invention provides a device comprising the circuitry of the first aspect, wherein the device comprises a battery powered device, a computer game controller, a virtual reality (VR) or augmented reality (AR) device, eyewear, a mobile telephone, a tablet or laptop computer, an accessory device, headphones, earphones or a headset.

According to a fifth aspect, the invention provides monitoring circuitry configured to receive a supply voltage applied to PWM circuitry and an input signal for the PWM circuitry, the monitoring circuitry configured to generate a modified input signal for the PWM circuitry based on the input signal and the supply voltage.

According to a sixth aspect, the invention provides PWM driver circuitry comprising:
PWM output circuitry; and
monitoring circuitry, wherein the monitoring circuitry is configured to receive an input signal for the PWM output circuitry and a supply voltage applied to the PWM output driver circuitry and to generate a modified input signal for the PWM output circuitry based on the input signal and the supply voltage.

According to a seventh aspect, the invention provides PWM control circuitry comprising:
PWM output driver circuitry configured to generate a PWM signal based on an input signal; and circuitry configured to introduce a time offset into the PWM signal, wherein the time offset is based on a magnitude of a supply voltage applied to the PWM output driver circuitry.

According to an eighth aspect, the invention provides circuitry comprising:

a pulse-width modulator configured to output a pulse-width modulated signal; and circuitry configured to monitor a supply voltage to the modulator and to output a control signal for controlling the modulator, wherein the control signal is based on the supply voltage.

According to a ninth aspect, the invention provides a pulse-width modulator configured to output a pulse-width modulated signal comprising:

circuitry configured to monitor a supply voltage to the modulator and to output a control signal for controlling the modulated signal, wherein the control signal is based on the supply voltage.

According to a tenth aspect, the invention provides circuitry for driving a load using a PWM signal, wherein the circuitry is configured to control or adjust a width of one or more PWM pulses to compensate for changes in a supply voltage supplied to a PWM modulator of the circuitry in order to maintain a consistent average voltage per PWM period for a given load condition.

BRIEF DESCRIPTION OF THE DRAWINGS

Embodiments of the invention will now be described, strictly by way of example only, with reference to the accompanying drawings, of which:

FIGS. 6a and 6b are timing diagrams illustrating the operation of the circuitry of FIG. 5;

FIGS. 9a and 9b are timing diagrams illustrating the operation of the circuitry of FIG. 8;

DETAILED DESCRIPTION

Figure 1:
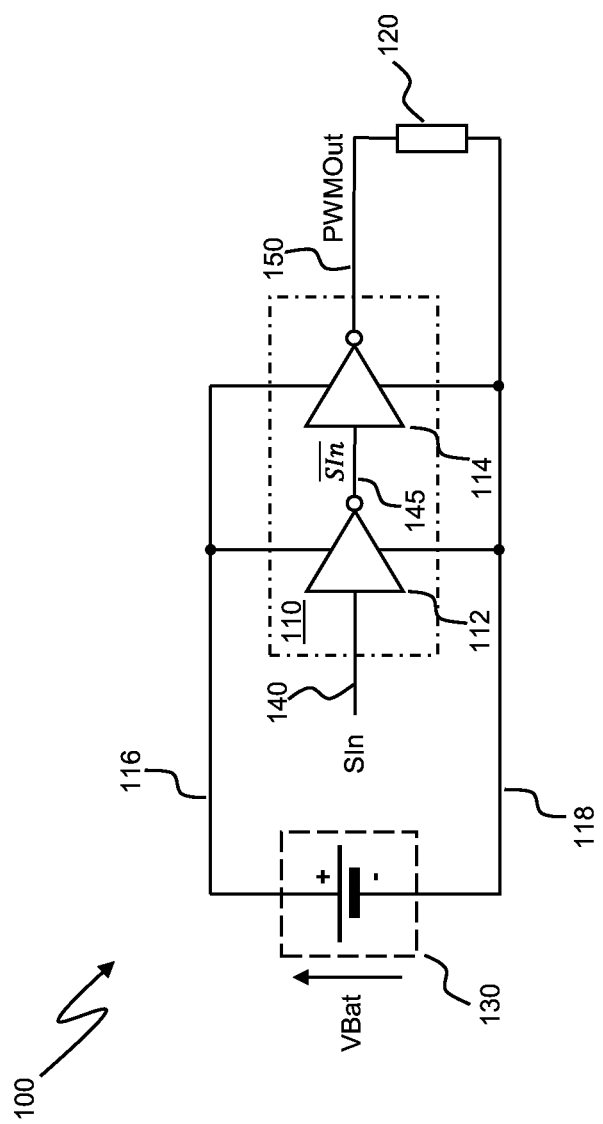
FIG. 1 is a schematic diagram illustrating circuitry for driving a transducer using a PWM signal.

FIG. 1 is a simplified schematic diagram of circuitry for driving a transducer using a PWM signal. The circuitry, shown generally at 100, includes PWM output driver circuitry 110 coupled to a load 120. The load 120 may be, for example, a transducer such as a motor, LED (or LED array), a servo, a haptic transducer, a resonant actuator or the like. Alternatively, the load 120 may be, for example, electronic circuitry such as an audio amplifier, for example.

The PWM output driver circuitry 110 receives a supply voltage VBat from a power supply, which in this example is a battery 130, but which could equally be a power supply or a power converter, regulator or the like whose output voltage can vary due to transient loads from other components or systems of a host device incorporating the circuitry 100.

The PWM output driver circuitry 110 in this example comprises first and second series connected inverters, respectively 112 and 114. The first inverter 112 receives at its input node 140 a digital input signal SIn and outputs at its output node 145 the digital inverse signal of SIn, i.e. $\overline{\text{SIn}}$. The second inverter 114 receives at its input node 140 the inverse digital signal $\overline{\text{SIn}}$ and outputs at its output node 150 an inverse digital output signal PWMOut. Thus, the digital output signal PWMOut has the same logic state or level as the digital input signal SIn.

To maintain a constant average voltage per PWM period (and thus to maintain a consistent output of the load 120, e.g. a consistent motor speed, in the case where the load 120 is a DC motor, or to maintain a consistent light intensity, in the case where the load 120 is an LED or an LED array), the PWM output driver circuitry 110 generates the PWM output signal PWMOut with a constant duty cycle or mark-to-space ratio. This approach is effective when the supply voltage VBat remains constant. However, if the supply voltage VBat changes, e.g. decreases as a result of discharge of the battery 130 over time and/or as a result of other components, systems, transients or circuitry of the host device drawing current from the battery 130, the average voltage of the PWM output signal PWMOut over a PWM signal period also falls, as will now be explained with reference to FIG. 2.

Figure 2:
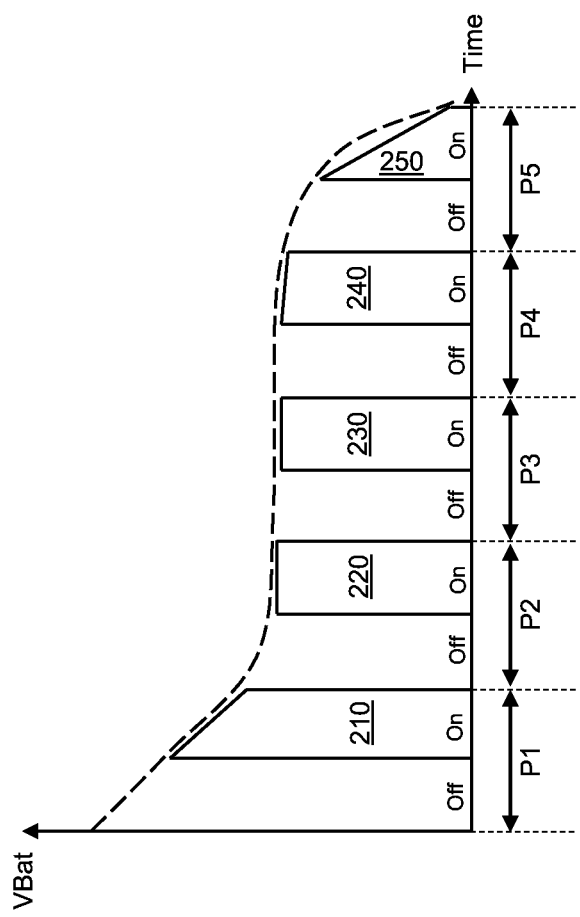
FIG. 2 is a graph illustrating a PWM signal output by the circuitry of FIG. 1 over time.

FIG. 2 illustrates example PWM pulses 210-250 output by the PWM output driver circuitry 110 as the supply voltage VBat (shown in dashed line in FIG. 2) decreases over a plurality of PWM time periods P1-P5. It is to be understood that FIG. 2 is a highly simplified representation of the PWM pulses 210-250, for illustrative purposes only. As will be appreciated by those of ordinary skill in the art, in a real application the frequency of a PWM signal will be very much higher, e.g. of the order of kilohertz or megahertz.

As will be appreciated by those of ordinary skill in the art, the average voltage (or, equivalently, the average power) supplied by the PWM output driver circuitry 110 to the load 120 during a first PWM period P1 is represented by the area of the pulse 210. Similarly, the average voltage supplied by the PWM output driver circuitry 110 to the load 120 during each of the PWM periods P2-P5 is represented by the area of the pulses 220-250 respectively.

If the supply voltage VBat were constant then the average voltage supplied to the load 120 by the PWM output driver circuitry 110 during each of the PWM periods P1-P5 would be the same, so the pulses 210-250 would all have the same area. However, in the illustrated example the supply voltage VBat decreases over time, and thus although the width of each of the pulses 210-250 (i.e. the on-time in each PWM period) is the same, the pulses 210-250 are not all of the same voltage magnitude (i.e. are not all of the same amplitude or height), and so the average voltage supplied to the load 120 per PWM period is not constant. This leads to inconsistency in the output signal PWMOut that drives the load 120, which leads to, for example, an inconsistent motor speed in the case where the transducer 130 is a DC motor, or an inconsistent light intensity in the case where the load 120 is an LED or an LED array.

Figure 3:
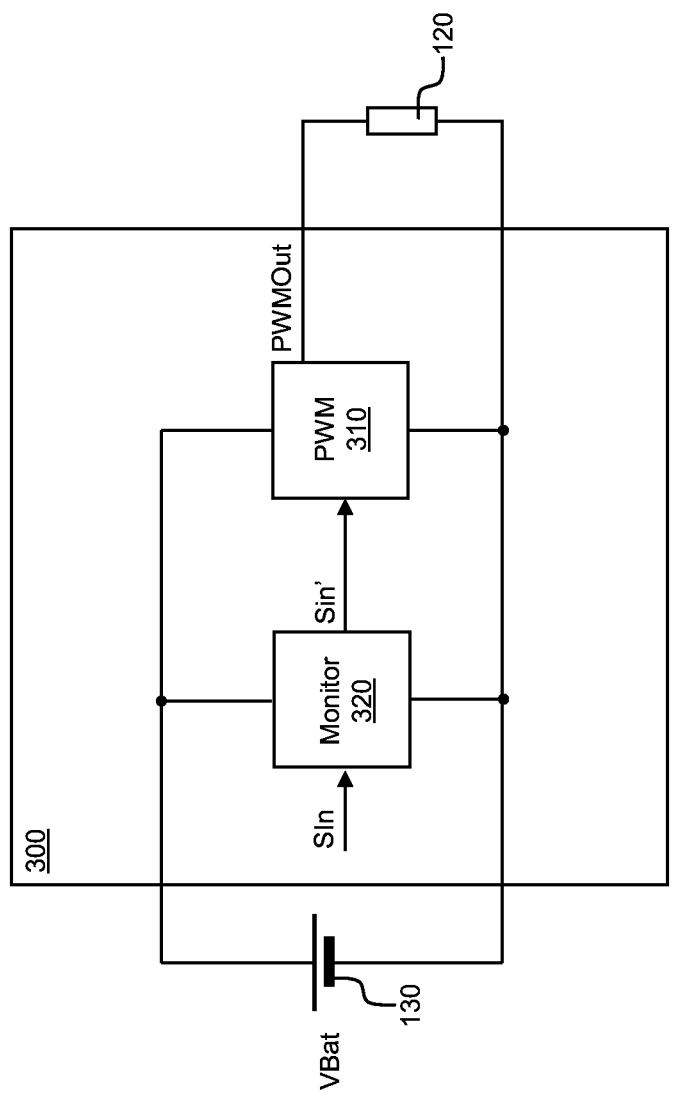
FIG. 3 is a schematic diagram illustrating example circuitry for driving a transducer using a PWM signal according to the present disclosure.

FIG. 3 is a schematic representation of circuitry for driving a load 120 using a PWM signal which is configured to control or adjust the width of one or more PWM pulses to compensate for changes in the supply voltage to a PWM output driver circuitry 310 in order to maintain a consistent average voltage per PWM period and thus consistent load output performance.

The circuitry, shown generally at 300 in FIG. 3, includes elements in common with the circuitry 100 of FIG. 1. Such common elements are denoted by common reference numerals and will not be described in detail here.

The circuitry 300 includes PWM output driver circuitry 310, which is the same as the PWM output driver circuitry 110 of FIG. 1 in construction and operation, and thus will not be described in detail here.

The circuitry 300 further includes monitoring circuitry 320 which is configured to receive the supply voltage VBat and the input signal SIn and to output a modified input signal SIn', based on a level (e.g. an amplitude) of the supply voltage VBat and on the input signal SIn, to the PWM output driver circuitry 310. Operation of the PWM output driver circuitry 310 is thus controlled based on the modified input signal SIn', as will be described in more detail below.

The PWM output driver circuitry 310 in the illustrated example is configured to receive the modified input signal SIn' from the monitoring circuitry 320 and to output an output PWM signal PWMOut based on the modified input signal SIn'. The modified input signal SIn' can therefore be regarded as a control signal that is based on the supply voltage VBat and the input signal SIn and that is output by the monitoring circuitry 320 for controlling the operation of the PWM output driver circuitry 310. Thus, the circuitry 300 can control or adapt the pulse width of one or more pulses of the PWM output signal PWMOut so as to maintain a required average voltage (or equivalently, a required average output power) per PWM period in response to a changing supply voltage VBat, in order to maintain a required load condition (e.g. a required motor speed, where the load 120 is a motor).

Figure 4:
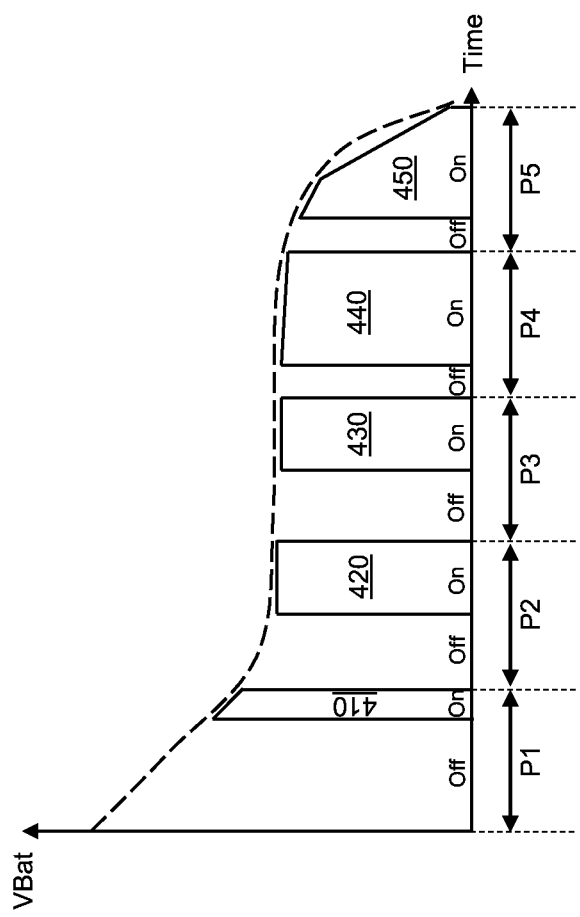
FIG. 4 is a graph illustrating a PWM signal output by the circuitry of FIG. 3 over time.

This approach is illustrated in FIG. 4, which illustrates example PWM pulses 410-450 output by the PWM output driver circuitry 310 as the supply voltage VBat (shown in dashed line in FIG. 4) decreases over a plurality of PWM time periods P1-P5.

In contrast with the pulses 210-250 shown in FIG. 2, the pulses 410-450 are not of the same width (i.e. duration). Instead, the first pulse 410 of the first PWM period P1 is narrower (i.e. has a shorter duration) than the second and third pulses 430, 440 of the second and third PWM periods P2, P3. The fourth pulse 440 of the fourth PWM period P4 is slightly wider (has a slightly longer duration) than the second and third pulses 420, 430, and the fifth pulse 450 of the fifth PWM period is also wider (has a longer duration) than the second and third pulses 420, 430. (It is to be noted that the widths of the pulses are exaggerated in FIG. 4 for purposes of illustration, and thus the illustrative pulses 410-450 shown in FIG. 4 are not necessarily of equal area. However, as will be apparent from the following description, each of the pulses 410-450 represents the same average voltage per PWM period.)

The PWM output driver circuitry 310 thus controls or adjusts (relative to a default pulse width) the width of the pulses 410-450 to compensate for the changing supply voltage VBat, such that the average voltage supplied to the load 120 over each of the PWM periods P1-P5 is the same, in order to maintain a required load condition (e.g. a required motor speed, where the load 120 is a motor). Thus, for the first pulse 410 the pulse width has been reduced in comparison to the second and third pulses 420, 430, to compensate for its increased amplitude (height) relative to the second and third pulses 420, 430, whereas the pulse width of the fifth pulse 450 has been increased in comparison to the second and third pulses 420, 430, to compensate for its reduced amplitude (height) relative to the second and third pulses 420, 430. Thus the total area of each of the pulses 410-450 is the same.

Figure 5:
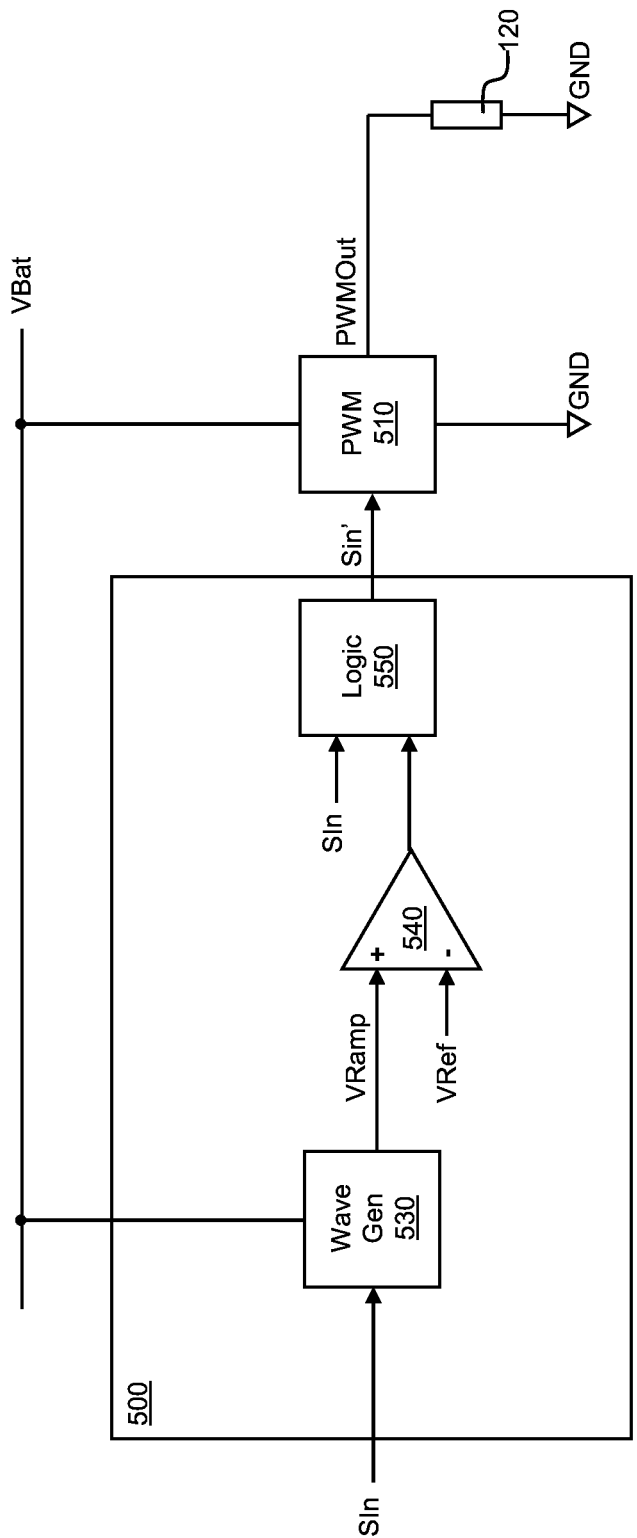
FIG. 5 is a schematic diagram illustrating example monitoring circuitry for use in the circuitry of FIG. 3.

FIG. 5 is a schematic representation of example circuitry implementing the monitoring circuitry 320. In the example illustrated in FIG. 5 the monitoring circuitry (shown generally at 500) is configured to generate a modified input signal SIn' and to output the modified input signal SIn' to PWM output driver circuitry 510 to control the operation of the PWM output driver circuitry 510.

The PWM output driver circuitry 510 of FIG. 5 is the same as the PWM output driver circuitry 110 of FIG. 1 in construction and operation and thus will not be described in detail here.

The monitoring circuitry 500 comprises waveform generator circuitry 530 configured to receive the supply voltage VBat (e.g. from battery 130) and the input signal SIn and to generate, in this example, an increasing ramp voltage VRamp, the rate of increase of which is based on the amplitude of the voltage VBat. The ramp voltage VRamp is output to a first, non-inverting (+), input of comparator circuitry 540. A second, inverting (−), input of the comparator circuitry 540 receives a reference or threshold voltage VRef from a suitable reference voltage source.

An output of the comparator circuitry 540 is coupled to a first input of logic circuitry 550, which may comprise one or more flip-flops, logic gates or the like, as will be apparent to those of ordinary skill in the art. A second input of the logic circuitry 550 receives the input signal SIn. An output of the logic circuitry 550 is coupled to an input of the PWM output driver circuitry 510 to provide the modified input signal SIn' to the PWM output driver circuitry 510 to control the operation of the PWM output driver circuitry 510.

The operation of the monitoring circuitry 500 will now be described with reference to the timing diagram of FIGS. 6a and 6b.

Figure 6A:
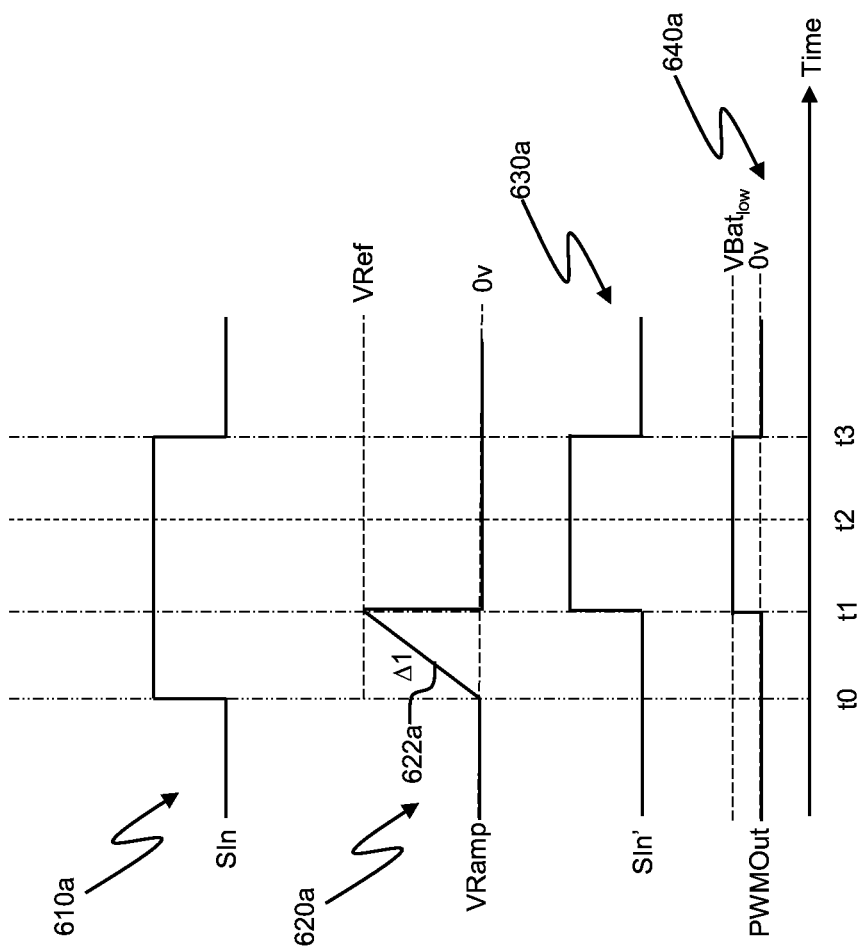

In FIG. 6a the uppermost trace 610a illustrates a single pulse of the input signal SIn, the second trace 620a illustrates the ramp voltage VRamp for relatively low supply voltage VBat$_{low}$, the third trace 630a illustrates the modified input signal SIn' for the relatively low supply voltage VBat$_{low}$ and the fourth trace 640a illustrates the PWM output signal PWMOut for the relatively low supply voltage VBat$_{low}$.

On detection of a rising edge of a pulse of the input signal SIn at time t0, the waveform generator circuitry 530 commences generating a ramp voltage that increases from 0v. The rate of change Δ1, i.e. the slope 622a, of the ramp voltage VRamp is based on the supply voltage, such that for a relative high supply voltage VBat$_{high}$, the ramp voltage VRamp increases more slowly than for a relatively lower supply voltage VBat$_{low}$, i.e. the rate of increase of the ramp voltage VRamp is inversely proportional to the supply voltage VBat.

Where the supply voltage is relatively low (i.e. VBat=VBat$_{low}$), the ramp voltage VRamp reaches the reference voltage VRef at a time t1. Between t0 and t1 the ramp voltage VRamp is less than the reference voltage VRef and thus the output of the comparator circuitry 540 is low. The output of the logic circuitry 550 is thus also low, and so the modified input signal SIn' is low. The PWM output signal PWMOut is therefore low. The ramp voltage VRamp may be reset to 0v when the reference voltage VRef is reached, or shortly thereafter.

At time t1 the ramp voltage VRamp reaches the reference voltage VRef and the output of the comparator circuitry 540 thus goes high, which in turn causes the output of the logic circuitry 550 to go high and the modified input signal SIn' also to go high. Thus the PWM output signal PWMOut is equal to (or close to) VBat$_{low}$.

At the end of the pulse of the input signal SIn (at time t3), the output of the logic circuitry 550 goes low, SIn' goes low and PWMOut goes low again.

In FIG. 6b the uppermost trace 610b illustrates a single pulse of the input signal SIn, the second trace 620b illustrates the ramp voltage VRamp for relatively high supply voltage VBat$_{high}$, the third trace 630b illustrates the modified input signal SIn' for the relatively high supply voltage VBat$_{high}$ and the fourth trace 640b illustrates the PWM output signal PWMOut for the relatively high supply voltage VBat$_{high}$.

Where the supply voltage is relatively high (i.e. VBat=VBat$_{high}$), the ramp voltage VRamp reaches the reference voltage VRef later than when the supply voltage is relatively low (i.e. VBat=VBat$_{low}$), at a time t2, i.e. the rate of change Δ2 (i.e. the slope 622b) of the ramp voltage VRamp is less than when the supply voltage is relatively low. Between t0 and t2 the ramp voltage VRamp is less than the reference voltage VRef and thus the output of the comparator circuitry 540 is low. The output of the logic circuitry 550 is thus also low, and so the modified input signal SIn' is low. The PWM output signal PWMOut is therefore low.

At time t2 the ramp voltage VRamp reaches the reference voltage VRef and the output of the comparator circuitry 540 thus goes high, which in turn causes the output of the logic circuitry 550 to go high and the modified input signal SIn' also to go high. Thus the PWM output signal PWMOut is equal to (or close to) VBat$_{high}$. The ramp voltage VRamp may be reset to 0v when the reference voltage VRef is reached, or shortly thereafter.

At the end of the pulse of the input signal SIn (at time t3), the output of the logic circuitry 550 goes low, SIn' also goes low and PWMOut goes low again.

On detection of the rising edge of the next pulse of the input signal SIn the ramp signal VRamp is at 0v (or is reset to 0v if it has not already been reset to 0v) and again begins to increase, based on the magnitude of the supply voltage VBat.

As will be apparent in particular from traces 630a, 630b, 640a, 640b, the monitoring circuitry 500 compensates for a relatively lower supply voltage VBat$_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 500 compensates for a relatively higher supply voltage VBat$_{high}$ by reducing the width (i.e. duration) of a pulse in a PWM period of the output signal PWMOut, so as to maintain a substantially constant average voltage per PWM period, despite the increased magnitude of the supply voltage.

The monitoring circuitry 500 essentially implements timer circuitry which introduces a time offset, based on the magnitude of the supply voltage VBat, into a PWM signal generated by the PWM output driver circuitry 510. The introduced time offset compensates for a change in the magnitude of the supply voltage VBat by changing the length or duration of a PWM pulse.

While the operation of the monitoring circuitry 500 has been described above in terms of generation of a ramp voltage VRamp, it will be appreciated by those of ordinary skill in the art that the waveform generator circuitry 530 need not generate a linear ramp, but may instead generate some other waveform having an amplitude that changes over time, based on the supply voltage VBat.

Figure 7:
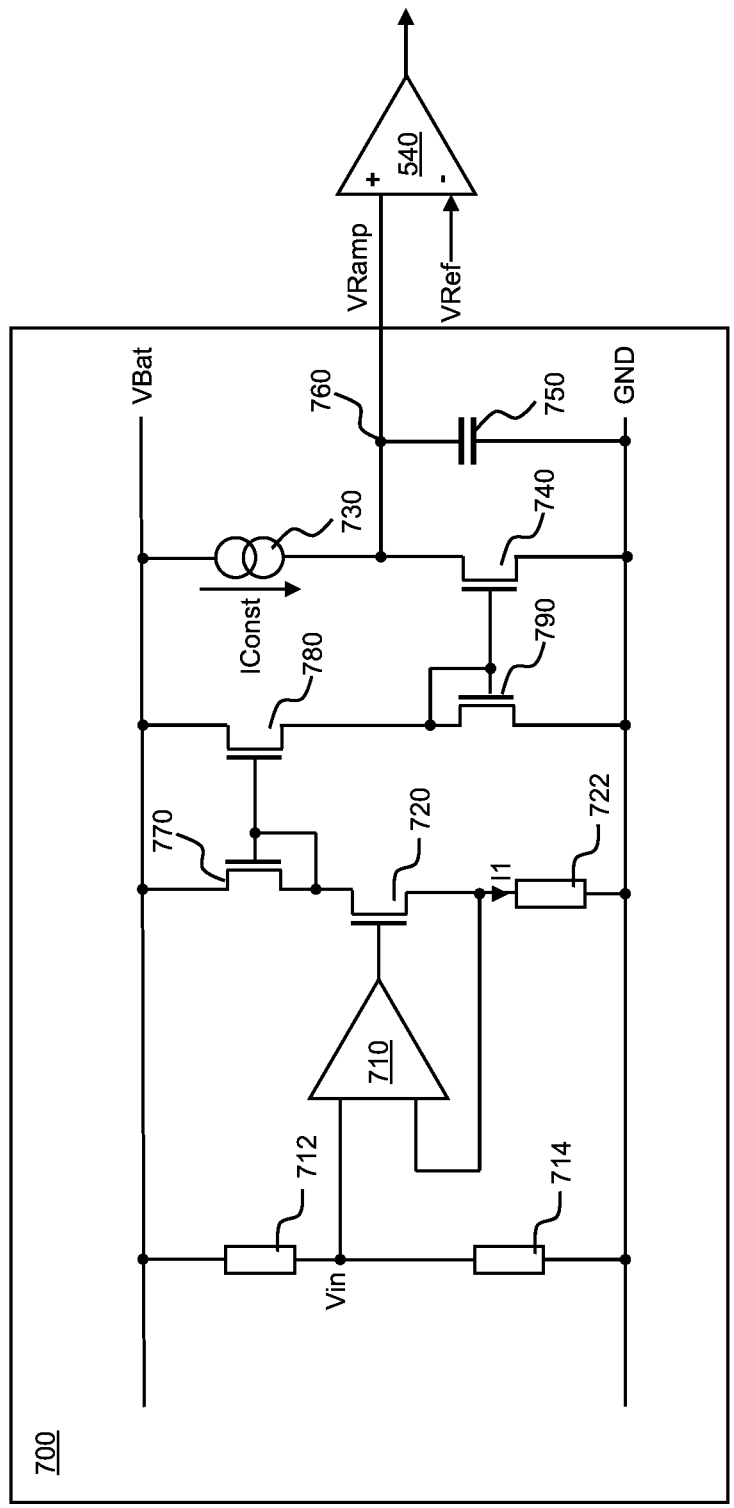
FIG. 7 is a schematic diagram illustrating example ramp generator circuitry.

FIG. 7 is a schematic representation of example circuitry implementing waveform generator circuitry 530 for the circuitry 500 of FIG. 5. In this example the circuitry comprises ramp generator circuitry.

The ramp generator circuitry, shown generally at 700 in FIG. 7, comprises amplifier circuitry 710 having a first input configured to receive a voltage Vin from a potential divider made up of first and second resistances 712, 714 coupled in series between a positive power supply voltage rail which receives the supply voltage VBat and a reference voltage supply rail GND which is coupled to ground or another suitable reference voltage. A second input of the amplifier circuitry receives a feedback signal from a feedback loop comprising a transistor 720 and a third resistance 722. Thus, as will be apparent to those of ordinary skill in the art, the amplifier circuitry 710 is configured to operate as a voltage to current converter to generate a voltage I1 that flows through the third resistance 722, where I1 is equal to Vin/R, where R is the resistance value of the third resistance 722.

The ramp generator circuitry 700 further comprises current generator circuitry 730, coupled in series with a second transistor 740 between the supply voltage rail and the reference voltage rail. A capacitor 750 is coupled in parallel with the transistor 740 between an output node 760 of the ramp generator circuitry 700 and the reference voltage supply rail GND.

The current I1 is mirrored to a control terminal (e.g. a gate terminal) of the second transistor 740 by current mirror transistors 770, 780, 790.

The second transistor 740 is operative to control the flow of a portion of the constant current IConst to the reference voltage supply rail GND. Thus, the second transistor 740 bleeds or diverts some of the current IConst that would otherwise flow to the capacitor 750, away from the capacitor 750, based on the current I1, which is proportional to the supply voltage VBat. Thus, as VBat increases, V1 increases and the current I1 also increases. This increase in I1 is mirrored to the control terminal of the second transistor 740, which therefore diverts more of the constant current IConst away from the capacitor 750, which reduces the rate of increase, i.e. slope, of the ramp voltage VRamp across the capacitor 750. In contrast, as VBat decreases, V1 decreases and the current I1 also decreases. The second transistor 740 diverts less of the constant current IConst away from the capacitor 750, thus increasing the rate of increase of the ramp voltage VRamp. Thus the rate of increase of the ramp voltage VRamp is inversely proportional to the supply voltage VBat.

Figure 8:
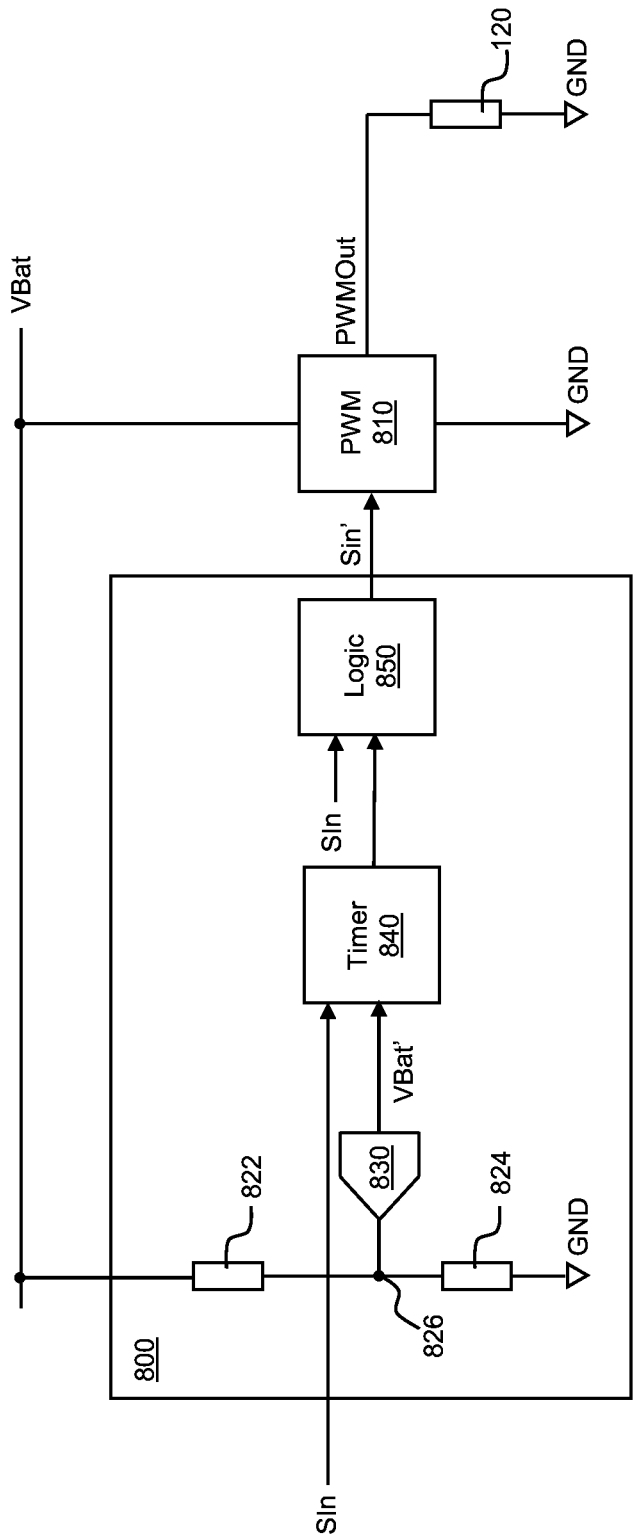
FIG. 8 is a schematic diagram illustrating alternative example monitoring circuitry.

FIG. 8 is a schematic representation of alternative example circuitry implementing the monitoring circuitry 320. In the example illustrated in FIG. 8 the monitoring circuitry (shown generally at 800) is configured to generate a modified input signal SIn' and to output the modified input signal SIn' to PWM output driver circuitry 810 to control the operation of the PWM output driver circuitry 810.

The PWM output driver circuitry 810 of FIG. 8 is the same as the PWM output driver circuitry 110 of FIG. 1 in construction and operation to and thus will not be described in detail here.

The monitoring circuitry 800 comprises first and second resistances 822, 824 coupled in series between a positive supply rail which receives the supply voltage VBat and a reference supply voltage GND (or some other suitable reference voltage source) so as to form a voltage divider. A node 826 intermediate the first and second resistances 822, 824 is coupled to an input of analogue-to-digital converter (ADC) circuitry 830. The ADC circuitry 830 thus receives an input voltage indicative of the supply voltage VBat, and outputs a digital signal VBat' representative of the supply voltage VBat.

An output of the ADC circuitry 830 is coupled to a first input of timer circuitry 840, which therefore receives the digital signal VBat'. A second input of the timer circuitry 840 receives the input signal SIn.

An output of the timer circuitry 840 is coupled to a first input of logic circuitry 850. A second input of the logic circuitry receives the input signal SIn. The logic circuitry 850 may comprise one or more flip-flops, logic gates or the like, as will be apparent to those of ordinary skill in the art, and is configured to receive a signal output by the timer circuitry 840 and the input signal SIn and to generate a modified input signal SIn' to output to the PWM output driver circuitry 810.

In operation of the monitoring circuitry 800, the ADC circuitry 830 outputs the digital signal VBat' indicative of the magnitude of the supply voltage VBat to the timer circuitry 840. On detection of a rising edge of a pulse of the input signal SIn the timer circuitry 840 commences timing a time period of a fixed duration. The fixed duration is based on the digital signal VBat' output by the ADC circuitry 830, such that the fixed duration d of the time period is inversely proportional to the magnitude of the supply voltage VBat. At the end of the time period, i.e. when the fixed duration has expired, the timer circuitry 840 outputs a signal to the logic circuitry 850, which starts an output pulse of the modified input signal SIn'. The output pulse of the modified input signal SIn' ends on detection by the logic circuitry 850 of the falling edge of the pulse of the input signal SIn.

The operation of the monitoring circuitry 800 will now be described with reference to the timing diagrams of FIGS. 9a and 9b.

Figure 9A:
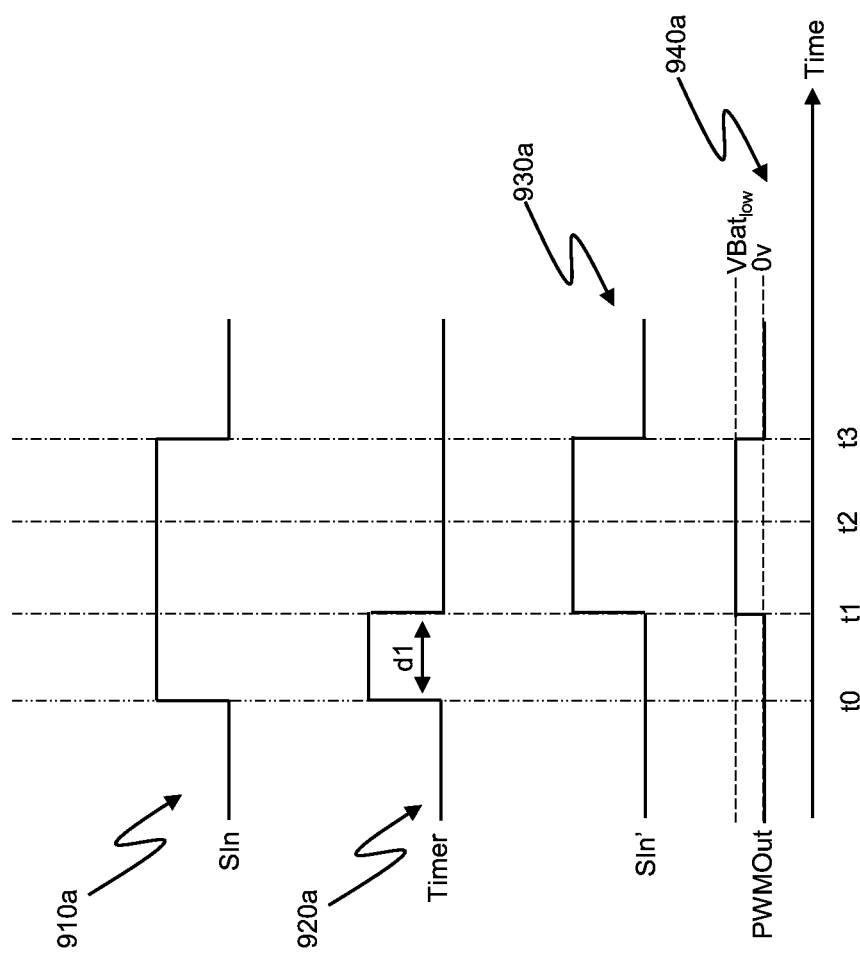

In FIG. 9a, the uppermost trace 910a illustrates a single pulse of the input signal SIn, the second trace 920a illustrates the operation of the timer circuitry 840 for a relatively low supply voltage $VBat_{low}$, the third trace 930a illustrates the modified input signal SIn' for the relatively low supply voltage $VBat_{low}$ and the fourth trace 940a illustrates the PWM output signal PWMOut for the relatively low supply voltage $VBat_{low}$.

On detection of a rising edge of a pulse of the input signal SIn at time t0, the timer circuitry 840 starts timing the time period, which, as discussed above, has a fixed duration d1 that is determined based on the value of the digital signal output by the ADC circuitry 830, such that for a relatively low supply voltage $VBat_{low}$, the fixed duration d1 is shorter than the fixed duration d2 for a relatively higher supply voltage $VBat_{high}$. Thus, the fixed duration of the time period is inversely proportional to the magnitude of the supply voltage VBat.

Where the supply voltage is relatively low (i.e. VBat=$VBat_{low}$), the fixed duration d1 of the time period expires at a time t1, at which point the timer circuitry 840 stops timing and provides a trigger signal to the logic circuitry 850. Until this trigger signal is received by the logic circuitry 850, the output of the logic circuitry 850 is low, and so the modified input signal SIn' is low. The PWM output signal PWMOut is therefore low.

At time t1 the fixed duration d1 of the time period expires and the timer circuitry 840 outputs the trigger signal to the logic circuitry 850, which in turn causes the output of the logic circuitry 850 to go high and the modified input signal SIn' also to go high. Thus the PWM output signal PWMOut is equal to (or close to) $VBat_{low}$.

At the end of the pulse of the input signal SIn (at time t3), the output of the logic circuitry 850 goes low, SIn' goes low and PWMOut goes low again.

In FIG. 9b, the uppermost trace 910b illustrates a single pulse of the input signal SIn, the second trace 920b illustrates the operation of the timer circuitry 840 for a relatively high supply voltage $VBat_{high}$, the third trace 930b illustrates the modified input signal SIn' for the relatively high supply voltage $VBat_{high}$ and the fourth trace 940b illustrates the PWM output signal PWMOut for the relatively high supply voltage $VBat_{high}$.

Where the supply voltage is relatively high (i.e. VBat=$VBat_{high}$), the fixed duration d2 of the time period of the timer circuitry 1140 expires later than when the supply voltage is relatively low (i.e. VBat=$VBat_{low}$), at a time t2, at which point the timer circuitry 840 outputs the trigger signal to the logic circuitry 850. Until the trigger signal is received, the output of the logic circuitry 850 is low, and so the modified input signal SIn' is low. The PWM output signal PWMOut is therefore low.

At time t2 the fixed duration d2 of the time period expires and the timer circuitry 840 outputs the trigger signal to the logic circuitry 850, which in turn causes the output of the logic circuitry 850 to go high and the modified input signal SIn' also to go high. Thus the PWM output signal PWMOut is equal to (or close to) $VBat_{high}$.

At the end of the pulse of the input signal SIn (at time t3), the output of the logic circuitry 850 goes low, SIn' also goes low and PWMOut goes low again.

On detection of the rising edge of the next pulse of the input signal SIn the timer circuitry 840 resets and begins timing a new time period, the fixed duration of which is based on the then-current magnitude of the supply voltage VBat.

As will be apparent in particular from traces 930a, 930b, 940a, 940b, the monitoring circuitry 800 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 800 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

Again, the monitoring circuitry 800 essentially implements timer circuitry which introduces a time offset, based on the magnitude of the supply voltage VBat, into a PWM signal generated by the PWM output driver circuitry 810. The introduced time offset compensates for a change in the magnitude of the supply voltage VBat by changing the length of a PWM pulse.

Figure 10:
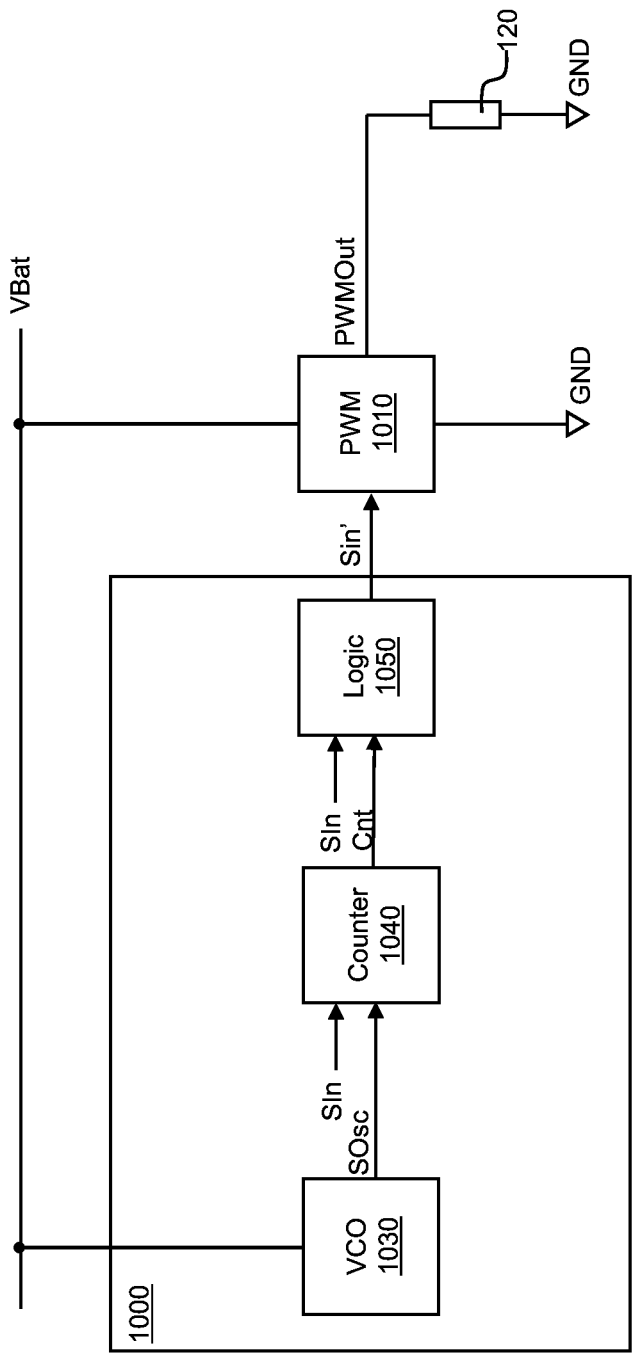
FIG. 10 is a schematic diagram illustrating further alternative example monitoring circuitry.

FIG. 10 is a schematic representation of further alternative example circuitry implementing the monitoring circuitry 320. In the example illustrated in FIG. 10 the monitoring circuitry (shown generally at 1000) is configured to generate a modified input signal SIn' and to output the modified input signal SIn' to PWM output driver circuitry 1010 to control the operation of the PWM output driver circuitry 1010.

The PWM output driver circuitry 1010 of FIG. 10 is the same as the PWM output driver circuitry 110 of FIG. 1 in construction and operation and thus will not be described in detail here.

The monitoring circuitry 1000 comprises voltage controlled oscillator (VCO) circuitry 1030 configured to receive the supply voltage VBat and to output an oscillating signal SOsc having a frequency fOsc which varies according to the magnitude of the supply voltage VBat. In this example the frequency fOsc of the oscillating signal SOsc is inversely proportional to the magnitude of the supply voltage VBat, such that when the supply voltage is relatively low (i.e. VBat=$VBat_{low}$), the frequency fOsc is higher than when the supply voltage is relatively high (i.e. VBat=$VBat_{high}$).

An output of the VCO circuitry 1030 is coupled to a first input of counter circuitry 1040. A second input of the counter circuitry 1040 receives the input signal SIn. The counter circuitry 1040 is configured to commence a count of cycles of the oscillating signal SOsc received at its first input on detection of a rising edge of a pulse of the input signal SIn, and to output a trigger signal to the logic circuitry 1050 when the value Cnt of the count reaches a count value CntVBat that represents the supply voltage VBat. As will be appreciated, the count value CntVBat that represents the supply voltage VBat will be reached more quickly at higher values of fOsc than at lower values of fOsc, and thus the count value CntVBat that represents the supply voltage VBat will be reached more quickly when the magnitude of the supply voltage VBat is relatively lower.

An output of the counter circuitry 1040 is coupled to a first input of logic circuitry 1050. A second input of the logic circuitry 1050 receives the input signal SIn. The logic circuitry 1050 may comprise one or more flip-flops, logic gates or the like, as will be apparent to those of ordinary skill in the art, and is configured to receive a trigger signal output by the counter circuitry 1040 and the input signal SIn and to generate a modified input signal SIn' to output to the PWM output driver circuitry 1010.

In operation of the monitoring circuitry 1000, the VCO circuitry 1030 outputs the oscillating signal SOsc, whose frequency fOsc is based on or indicative of the magnitude of the supply voltage VBat to the counter circuitry 1040. On detection of a rising edge of a pulse of the input signal SIn the counter circuitry 1040 commences counting oscillations of the oscillating signal SOsc until the count value CntVBat that represents the supply voltage VBat is reached, at which point the counter circuitry 1040 outputs the trigger signal to the logic circuitry 1050, which starts an output pulse of the modified input signal SIn'. The output pulse of the modified input signal SIn' ends on detection by the logic circuitry 1050 of the falling edge of the pulse of the input signal SIn.

The operation of the monitoring circuitry 1000 will now be described with reference to the timing diagrams of FIGS. 11a and 11b.

Figure 11A:
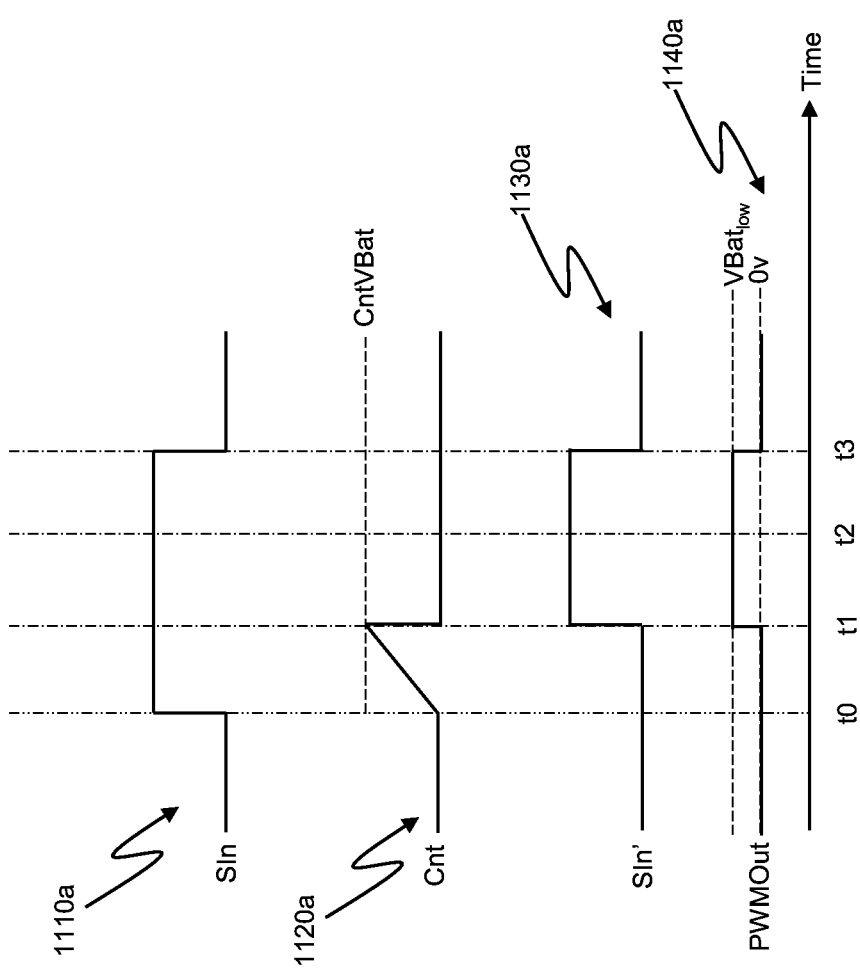
FIGS. 11a and 11b are timing diagrams illustrating the operation of the circuitry of FIG. 10.

In FIG. 11a the uppermost trace 1110a illustrates a single pulse of the input signal SIn, the second trace 1120a illustrates the count value Cnt for a relatively low supply voltage $VBat_{low}$, the third trace 1130a illustrates the modified input signal SIn' for the relatively low supply voltage $VBat_{low}$, the fourth trace 1140a the PWM output signal PWMOut for the relatively low supply voltage $VBat_{low}$.

On detection of a rising edge of a pulse of the input signal SIn at time t0, the counter circuitry 1040 starts counting cycles of the oscillating signal SOsc output by the VCO circuitry 1030. As discussed above, the frequency fOsc of the oscillating signal SOsc is based on the magnitude of the supply voltage VBat, such that for a relatively low supply voltage $VBat_{low}$, the frequency fOsc is higher than for a relatively higher supply voltage $VBat_{high}$.

Where the supply voltage is relatively low (i.e. VBat=$VBat_{low}$), the count value CntVBat that represents a magnitude of the supply voltage VBat is reached at a time t1, at which point the counter circuitry 1040 outputs the trigger signal to the logic circuitry 1050. The output of the logic circuitry 1050 is thus low until t1, and so the modified input signal SIn' is also low. The PWM output signal PWMOut is therefore low.

At time t1 the count value CntVBat that represents the magnitude of the supply voltage VBat is reached and counter circuitry 1040 outputs the trigger signal to the logic circuitry 1050, which in turn causes the output of the logic circuitry 1050 to go high and the modified input signal SIn' also to go high. Thus the PWM output signal PWMOut is equal to (or close to) $VBat_{low}$.

At the end of the pulse of the input signal SIn (at time t3), the output of the logic circuitry 1050 goes low, SIn' goes low and PWMOut goes low again. The count value Cnt may be reset to zero at an appropriate point, e.g. when it reaches CntVBat (or shortly thereafter), at the end of the pulse of the input signal SIn.

Figure 11B:
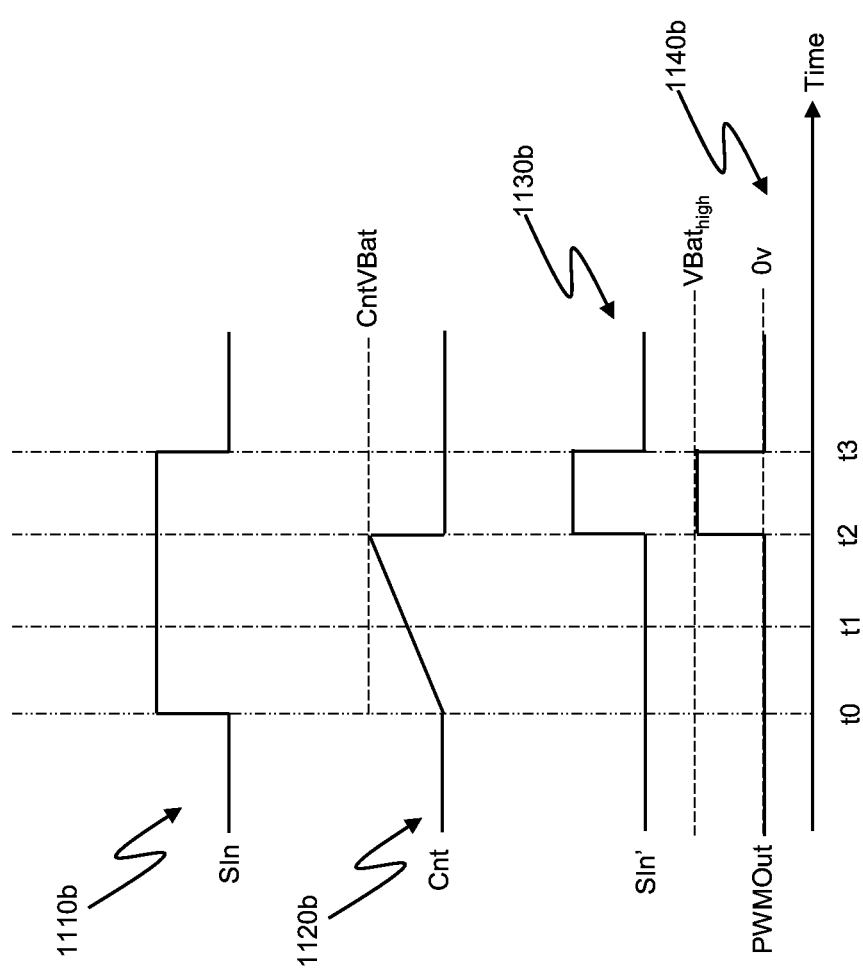

In FIG. 11b the uppermost trace 1110b illustrates a single pulse of the input signal SIn, the second trace 1120b illustrates the count value Cnt of the counter circuitry 1040 for a relatively high supply voltage $VBat_{high}$, the third trace 1130b illustrates the modified input signal SIn' for the relatively high supply voltage $VBat_{high}$, and the fourth trace 1140b illustrates the PWM output signal PWMOut for the relatively high supply voltage $VBat_{high}$.

Where the supply voltage is relatively high (i.e. VBat=$VBat_{high}$), the count value CntVBat that represents the magnitude of the supply voltage VBat is reached later than when the supply voltage is relatively low (i.e. VBat=$VBat_{low}$), at a time t2, at which point the counter circuitry 1040 outputs the trigger signal to the logic circuitry 1050. The output of the logic circuitry 1050 is thus low until t2, and so the modified input signal SIn' is also low. The PWM output signal PWMOut is therefore low.

At time t2 the count value CntVBat that represents the magnitude of the supply voltage VBat is reached and the counter circuitry 1040 outputs the trigger signal to the logic circuitry 1050, which in turn causes the output of the logic circuitry 1050 to go high and the modified input signal SIn' also to go high. Thus the PWM output signal PWMOut is equal to (or close to) $VBat_{high}$.

At the end of the pulse of the input signal SIn (at time t3), the output of the logic circuitry 1050 goes low, SIn' also goes low and PWMOut is also low. The count value Cnt may be reset to zero at an appropriate point, e.g. when it reaches CntVBat (or shortly thereafter), at the end of the pulse of the input signal SIn.

On detection of the rising edge of the next pulse of the input signal SIn the counter circuitry 1040 resets (if it has not previously been reset) and begins counting oscillations of the signal SOsc, whose frequency fOsc which is based on the then-current magnitude of the supply voltage VBat.

As will be apparent in particular from traces 1130a, 1130b, 1140a, 1140b, the monitoring circuitry 1000 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 1000 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

Again, the monitoring circuitry 1000 essentially implements timer circuitry which introduces a time offset, based on the magnitude of the supply voltage VBat, into a PWM signal generated by the PWM output driver circuitry 1010. The introduced time offset compensates for a change in the magnitude of the supply voltage VBat by increasing the length of a PWM pulse.

In the examples described above, the monitoring circuitry 320 adjusts the width (i.e. duration) of a pulse in a PWM period of the output signal PWMOut by adjusting the point in time at which the output signal PWMOut rises from 0v to the supply voltage VBat (i.e. the rising edge of the output signal PWMOut), while maintaining the point in time at which the output signal PWMOut drops from VBat to 0v (i.e. the falling edge of the output signal PWMOut). Thus, the examples described above may be said to modulate the rising edge of the output signal PWMOut.

Figure 12:
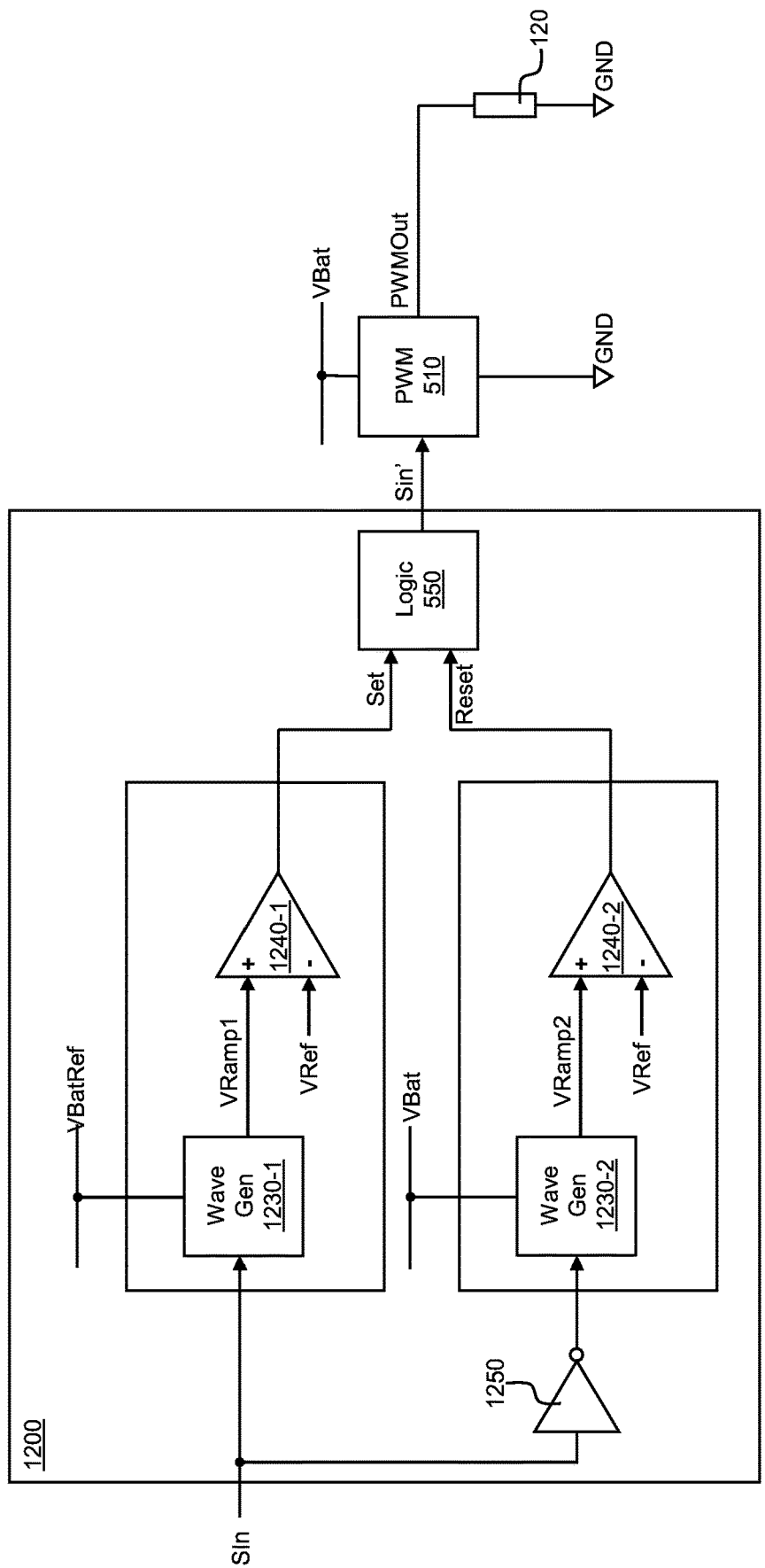
FIG. 12 is a schematic diagram illustrating further alternative example monitoring circuitry.

FIG. 12 is a schematic representation of alternative example circuitry implementing the monitoring circuitry 320. In the example illustrated in FIG. 12 the monitoring circuitry (shown generally at 1200) is configured to generate a modified input signal SIn' and to output the modified input signal SIn' to PWM output driver circuitry 510 to control the operation of the PWM output driver circuitry 510.

The PWM output driver circuitry 510 of FIG. 12 is the same as the PWM output driver circuitry 110 of FIG. 1 in construction and operation and thus will not be described in detail here.

The monitoring circuitry 1200 comprises first and second waveform generator circuitry 1230-1, 1230-2. The first waveform generator circuitry 1230-1 is configured to receive, as a supply voltage, a constant reference voltage VBatRef (e.g. from a voltage regulator or other suitable reference voltage source). The first waveform generator circuitry 1230-1 also receives the input signal SIn. The first waveform generator circuitry 1230-1 is configured to generate, in this example, a first increasing ramp voltage VRamp1. As the voltage VBatRef is constant, the rate of increase of the first ramp voltage VRamp1 is also constant. The first ramp voltage VRamp1 is output to a first, non-inverting (+), input of first comparator circuitry 1240-1. A second, inverting (−), input of the first comparator circuitry 1240-1 receives the reference voltage VRef.

The second waveform generator circuitry 1230-2 is configured to receive the supply voltage VBat (e.g. from battery 130) and an inverted version of the input signal SIn (as output by an inverter 1250 which receives the input signal SIn) and to generate, in this example, a second increasing ramp voltage VRamp2, the rate of increase of which is based on the amplitude of the voltage VBat. The second ramp voltage VRamp2 is output to a first, non-inverting (+), input of comparator circuitry 1240-2. A second, inverting (−), input of the comparator circuitry 1240-2 receives the same reference voltage VRef as the first comparator circuitry 1240-1.

Outputs of the first and second comparator circuitry 1240-1, 1240-2 are coupled, respectively, to first (set) and second (reset) inputs of logic circuitry 550, which may comprise one or more flip-flops, logic gates or the like, as will be apparent to those of ordinary skill in the art. An output of the logic circuitry 550 is coupled to an input of the PWM output driver circuitry 510 to provide the modified input signal SIn' to the PWM output driver circuitry 510 to control the operation of the PWM output driver circuitry 510.

The operation of the monitoring circuitry 1200 will now be described with reference to the timing diagram of FIGS. 13a and 13b.

Figure 13A:
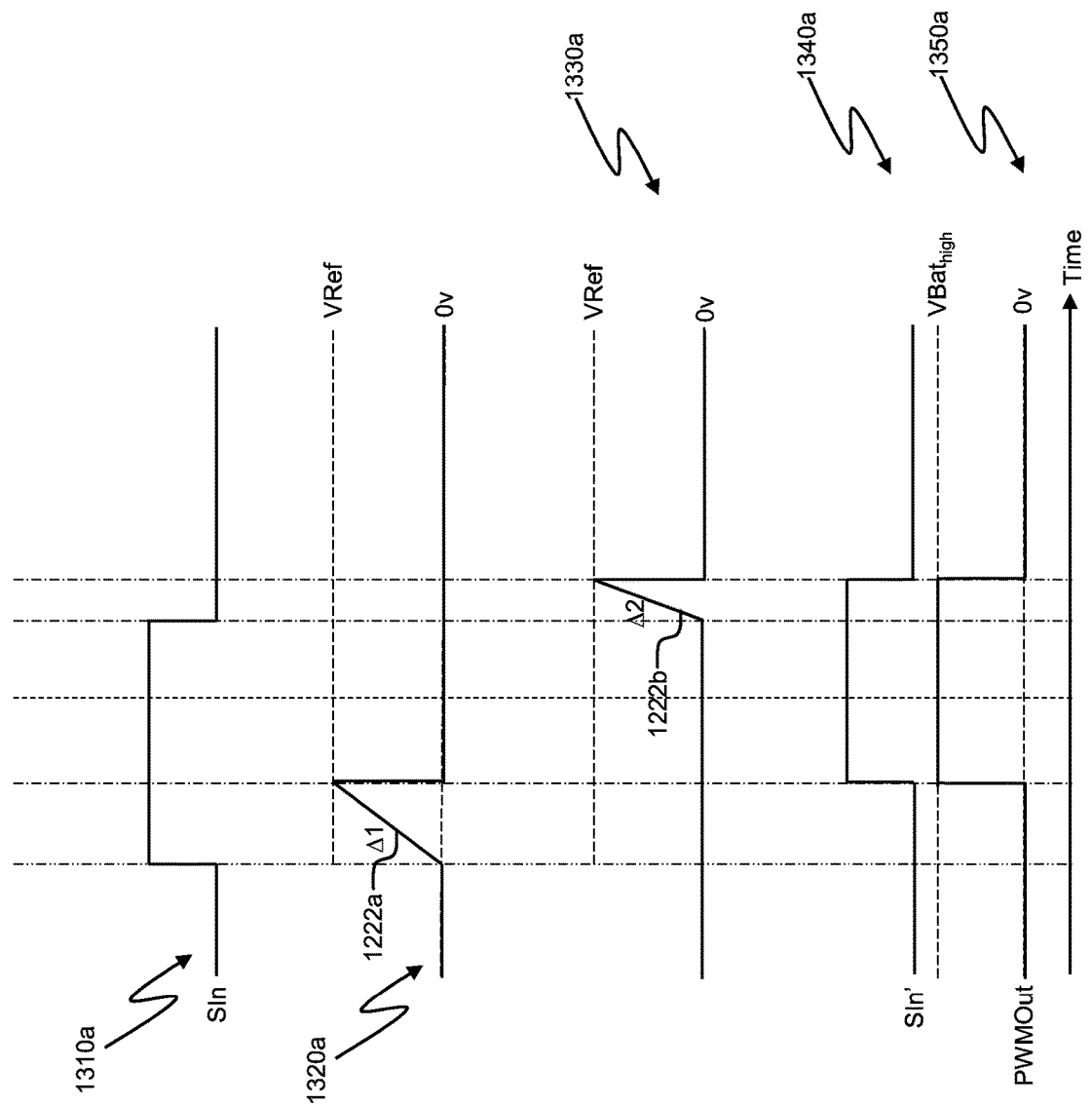
FIGS. 13a and 13b are timing diagrams illustrating the operation of the circuitry of FIG. 12.

In FIG. 13a the uppermost trace 1310a illustrates a single pulse of the input signal SIn, the second trace 1320a illustrates the first ramp voltage VRamp1, the third trace 1330a illustrates the second ramp voltage VRamp2, the fourth trace 1340a illustrates the modified input signal SIn' for the relatively high supply voltage $VBat_{high}$ and the fifth trace 1350a illustrates the PWM output signal PWMOut for the relatively high supply voltage $VBat_{high}$.

On detection of a rising edge of a pulse of the input signal SIn at time t0, the first ramp generator circuitry 1230-1 commences generating a first ramp voltage VRamp1 that increases from 0v. As explained above, the rate of change Δ1, i.e. the slope 1222a, of the first ramp voltage VRamp1 is constant.

The first ramp voltage VRamp1 reaches the reference voltage VRef at a time t1. Between t0 and t1 the ramp voltage VRamp is less than the reference voltage VRef and thus the output of the first comparator circuitry 1240-1 is low. The output of the logic circuitry 550 is thus also low, and so the modified input signal SIn' is low. The output signal PWMOut is therefore low. The first ramp voltage VRamp1 may be reset to 0v when the reference voltage VRef is reached, or shortly thereafter.

At time t1 the first ramp voltage VRamp1 reaches the reference voltage VRef and the output of the first comparator circuitry 1240-1 thus goes high, which in turn causes the output of the logic circuitry 550 to go high and the modified input signal SIn' also to go high. Thus the PWM output signal PWMOut is equal to (or close to) $VBat_{high}$.

At the end of the pulse of the input signal SIn (at time t3), the input signal SIn goes low, so the inverted version of the input signal SIn goes high, which causes the second ramp generator circuitry 1230-2 to commence generating a second ramp voltage VRamp2 that increases from 0V. The rate of change Δ2, i.e. the slope 1222b, of the second ramp voltage VRamp2 is based on the supply voltage VBat, such that for a relatively high supply voltage $VBat_{high}$, the second ramp voltage VRamp2 increases more quickly than for a relatively lower supply voltage $VBat_{low}$, i.e. the rate of increase of the second ramp voltage VRamp2 is proportional to the supply voltage VBat.

At time t4 the second ramp voltage VRamp2 reaches the reference voltage VRef and the output of the second comparator circuitry 1240-2 thus goes high, which in turn causes the output of the logic circuitry 550 to go low and the modified input signal SIn' also to go low. Thus the output signal PWMOut goes low again.

Figure 13B:
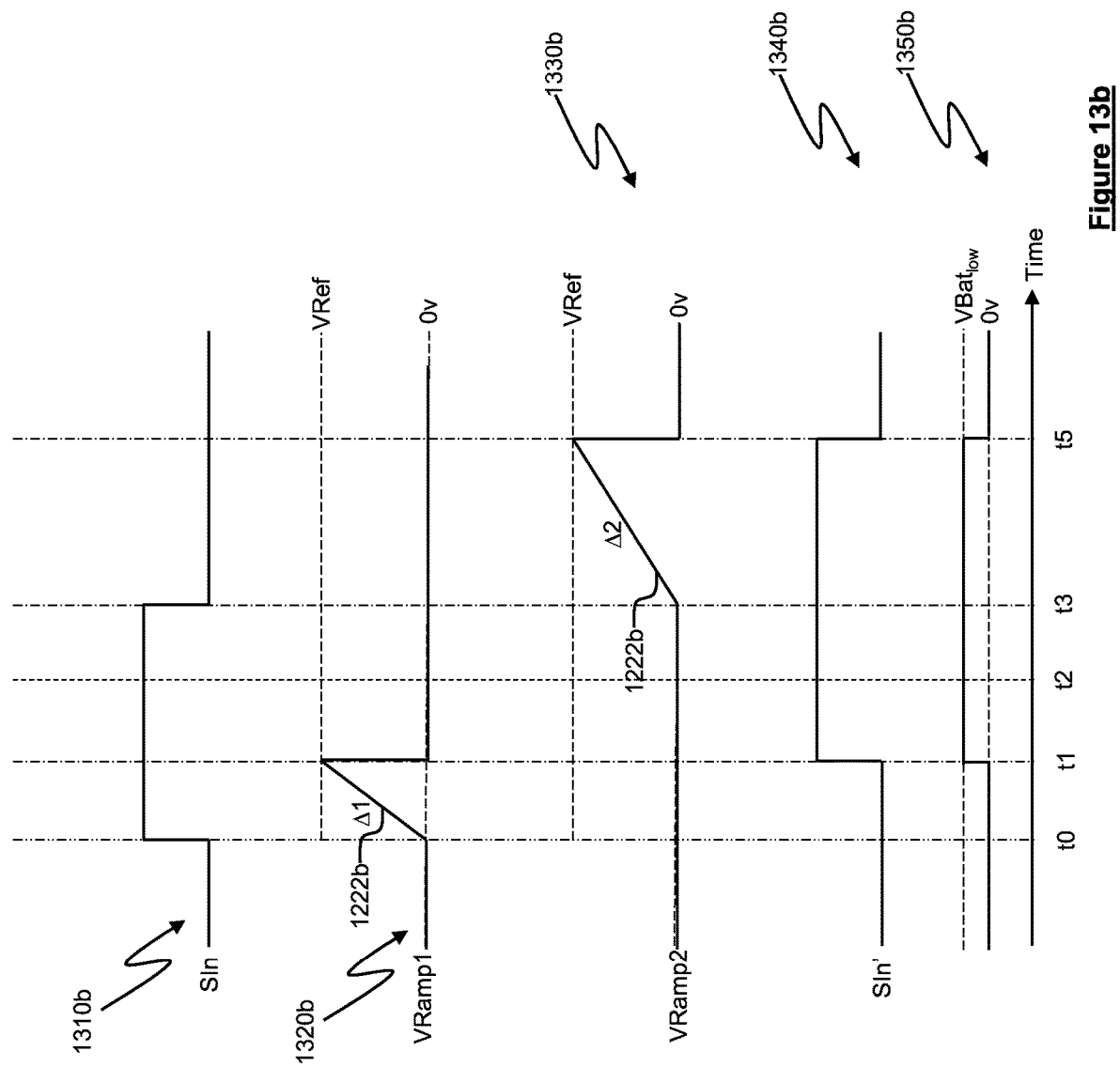

In FIG. 13b the uppermost trace 1310b illustrates a single pulse of the input signal SIn, the second trace 1320b illustrates the first ramp voltage VRamp1, the third trace 1330b illustrates the second ramp voltage VRamp2, the fourth trace 1340b illustrates the modified input signal SIn' for the relatively low supply voltage $VBat_{low}$ and the fifth trace 1350b illustrates the PWM output signal PWMOut for the relatively low supply voltage $VBat_{low}$.

As before, on detection of a rising edge of a pulse of the input signal SIn at time t0, the first ramp generator circuitry 1230-1 commences generating a first ramp voltage VRamp1 that increases, at a constant rate, from 0v.

The first ramp voltage VRamp1 reaches the reference voltage VRef at a time t1. Between t0 and t1 the ramp voltage VRamp is less than the reference voltage VRef and thus the output of the first comparator circuitry 1240-1 is low. The output of the logic circuitry 550 is thus also low, and so the modified input signal SIn' is low. The output signal PWMOut is therefore low. The first ramp voltage VRamp1 may be reset to 0v when the reference voltage VRef is reached, or shortly thereafter.

At time t1 the first ramp voltage VRamp1 reaches the reference voltage VRef and the output of the first comparator circuitry 1240-1 thus goes high, which in turn causes the output of the logic circuitry 550 to go high and the modified input signal SIn' also to go high. Thus the output signal PWMOut is equal to (or close to) $VBat_{low}$.

At the end of the pulse of the input signal SIn (at time t3), the input signal SIn goes low, so the inverted version of the input signal SIn goes high, which causes the second ramp generator circuitry 1230-2 to commence generating a second ramp voltage VRamp2 that increases from 0V. As the supply voltage VBat in this instance is relatively low (i.e. $VBat=VBat_{low}$), the second ramp voltage VRamp2 increases more slowly than in the example of FIG. 13a.

At time t5 the second ramp voltage VRamp2 reaches the reference voltage VRef and the output of the second comparator circuitry 1240-2 thus goes high, which in turn causes the output of the logic circuitry 550 to go low and the modified input signal SIn' also to go low. Thus the PWM output signal PWMOut goes low (e.g. 0V or close to 0V) again.

As will be apparent in particular from traces 1340a, 1340b, 1350a, 1350b, the monitoring circuitry 1200 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 1200 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

In contrast to the examples discussed above and illustrated in FIGS. 5-11b, in this example the rising edge of the output signal PWMOut is not modulated, i.e. the position in time of the rising edge of the output signal PWMOut does not change (in the example of FIGS. 12, 13a and 13b the rising edge of the output signal PWMOut always coincides with t1). Instead, the timing of the falling edge of the output signal PWMOut changes to compensate for changes in the supply voltage. Thus the length (duration) of a PWM pulse of the output signal PWMOut can be increased or decreased in order to compensate for changes in the magnitude of the supply voltage and thereby maintain a substantially constant average voltage per PWM period.

While the operation of the monitoring circuitry 1200 has been described above in terms of generation of a ramp voltage VRamp, it will be appreciated by those of ordinary skill in the art that the waveform generator circuitry 1230-1, 1230-2 need not generate linear ramps, but may instead generate some other waveform having an amplitude that changes over time.

Figure 14:
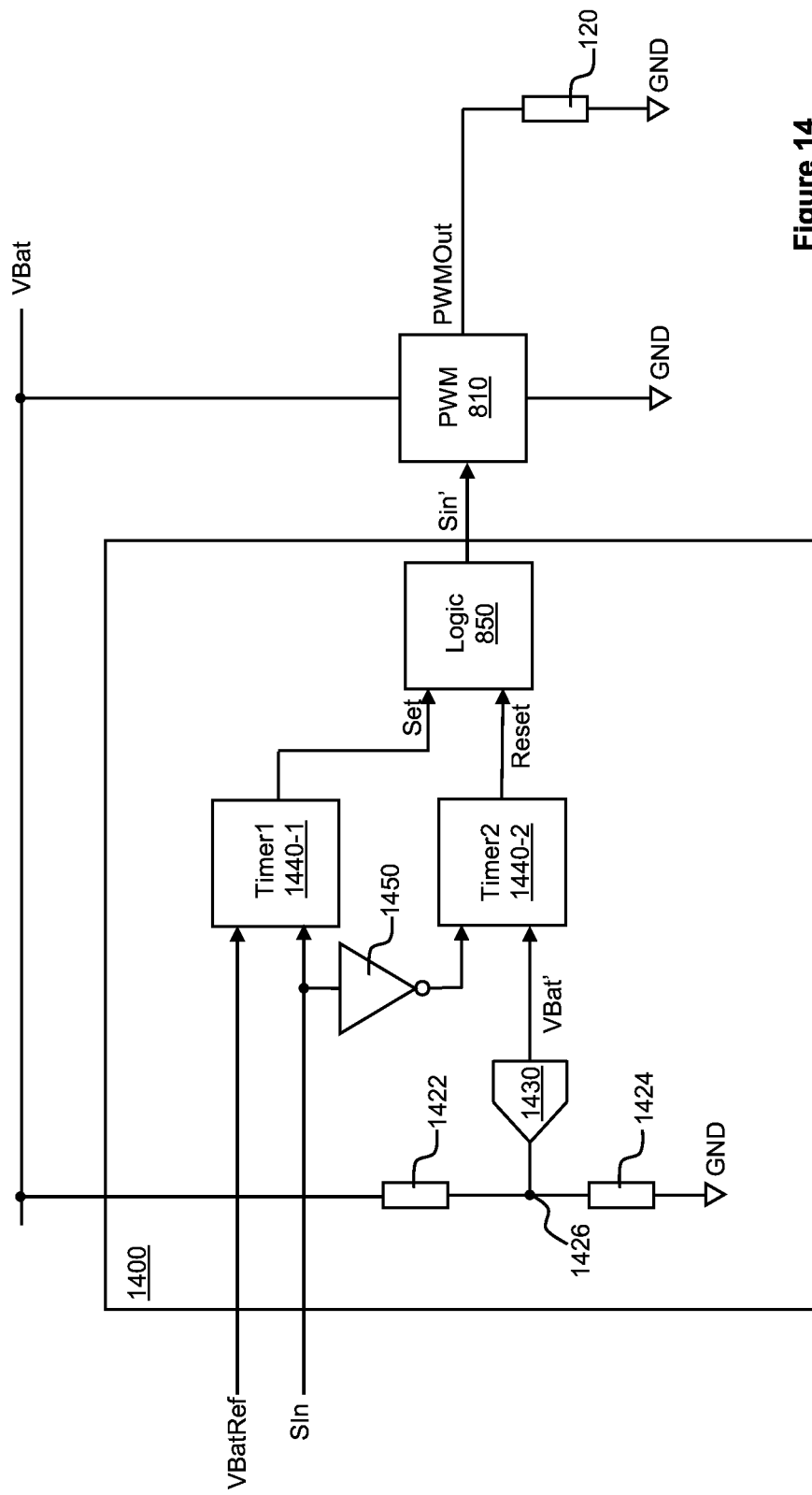
FIG. 14 is a schematic diagram illustrating further alternative example monitoring circuitry.

FIG. 14 is a schematic representation of alternative example circuitry implementing the monitoring circuitry 320. In the example illustrated in FIG. 14 the monitoring circuitry (shown generally at 1400) is configured to generate a modified input signal SIn' and to output the modified input signal SIn' to PWM output driver circuitry 810 to control the operation of the PWM output driver circuitry 810.

The PWM output driver circuitry 810 of FIG. 14 is the same as the PWM output driver circuitry 110 of FIG. 1 in construction and operation to and thus will not be described in detail here.

The monitoring circuitry 1400 comprises first timer circuitry 1440-1 and second timer circuitry 1440-2. The first timer circuitry 1440-1 receives, at a first input thereof, a digital signal indicative of a reference voltage VBatRef. A second input of the first timer circuitry 1440-1 receives the input signal SIn.

The monitoring circuitry 1400 further comprises first and second resistances 1422, 1424 coupled in series between a positive supply rail which receives the supply voltage VBat and a reference supply voltage GND (or some other suitable reference voltage source) so as to form a voltage divider. A node 1426 intermediate the first and second resistances 1422, 1424 is coupled to an input of analogue-to-digital converter (ADC) circuitry 1430. The ADC circuitry 1430 thus receives an input voltage indicative of the supply voltage VBat, and outputs a digital signal VBat' representative of the supply voltage VBat.

An output of the ADC circuitry 1430 is coupled to a first input of the second timer circuitry 1440-2, which therefore receives the digital signal VBat'. A second input of the second timer circuitry 1440-2 is coupled to an output of an inverter 1450 which receives the input signal SIn, such that the second input of the second timer circuitry 1440-2 receives an inverted version of the input signal SIn.

The output of the first timer circuitry 1440-1 is also coupled to a first (set) input of logic circuitry 850. An output of the second timer circuitry 1440-1 is coupled to a second (reset) input of the logic circuitry 850. The logic circuitry 850 may comprise one or more flip-flops, logic gates or the like, as will be apparent to those of ordinary skill in the art, and is configured to receive the signals output by the first and second timer circuitry 1440-1, 1440-2 and to generate a modified input signal SIn' to output to the PWM output driver circuitry 810.

In operation of the monitoring circuitry 1400, the first timer circuitry 1440-1 receives the digital signal indicative of the reference voltage VBatRef, which determines the duration d1 of a first time period that is timed by the first timer circuitry 1440-1. On detection, by the first timer circuitry 1440-1, of a rising edge of a pulse of the input signal SIn, the first timer circuitry 1440-1 commences timing the first time period and, at the end of the first time period, outputs a signal to the first (set) input of the logic circuitry 850, which starts an output pulse of the modified input signal SIn'.

The second timer circuitry 1440-2 receives the digital signal VBat' indicative of the magnitude of the supply voltage VBat, and this signal determines the duration d2 of the second time period that is timed by the second timer circuitry 1440-2. On detection, by the second timer circuitry 1440-2, of a rising edge of a pulse of the inverted version of the input signal SIn, the second timer circuitry 1440-2 commences timing a second time period. Thus the second timer circuitry 1440-2 is triggered by the falling edge of a pulse of the input signal SIn. The duration d2 of the second time period is inversely proportional to the magnitude of the supply voltage. At the end of the second time period, i.e. when the duration d2 has expired, the second timer circuitry 1440-2 outputs a signal to the second (reset) input of the logic circuitry 850, which ends the output pulse of the modified input signal SIn'.

The operation of the monitoring circuitry 1400 will now be described with reference to the timing diagrams of FIGS. 15*a* and 15*b*.

Figure 15A:
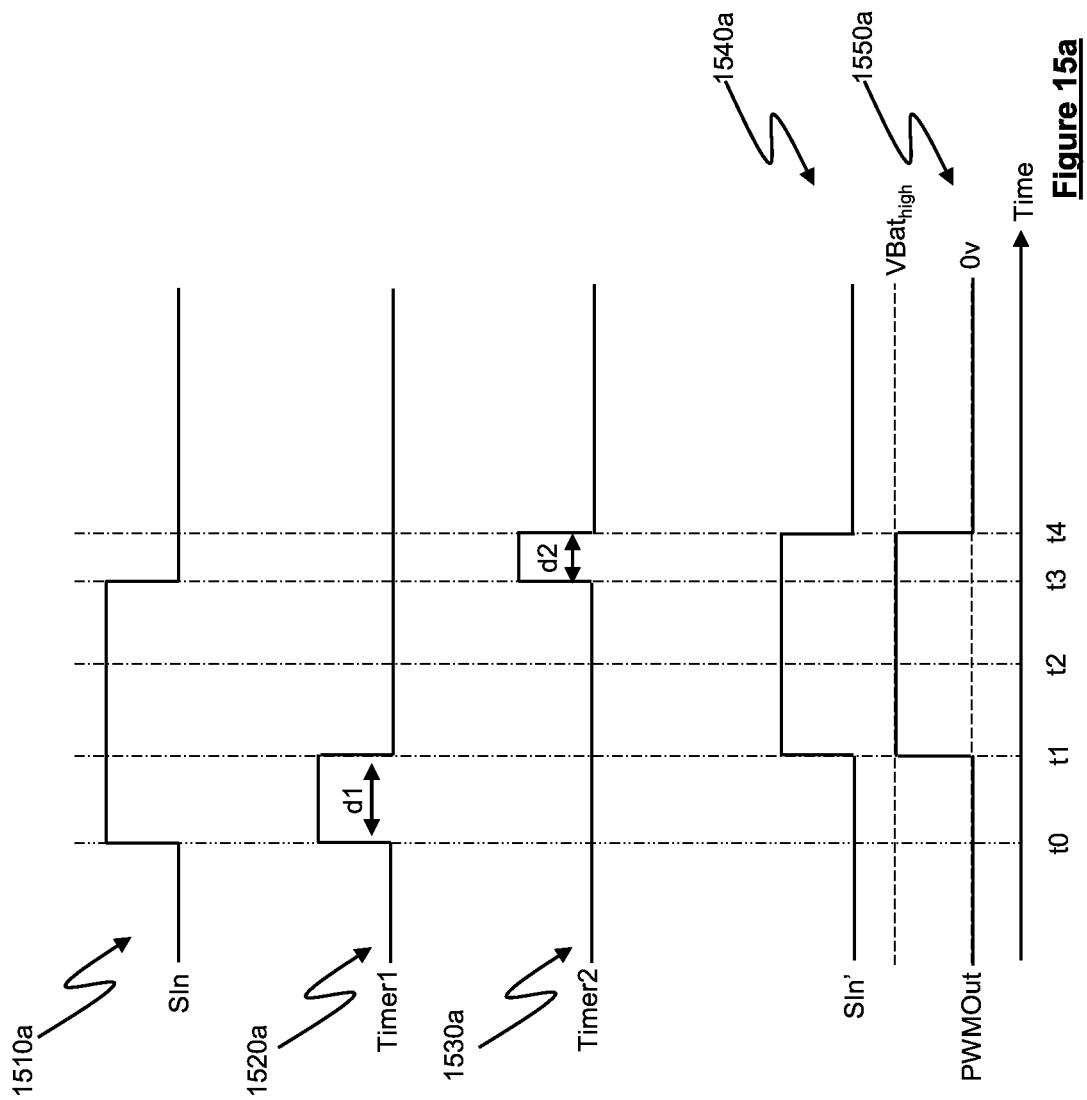
FIGS. 15a and 15b are timing diagrams illustrating the operation of the circuitry of FIG. 14.

In FIG. 15*a*, the uppermost trace 1510*a* illustrates a single pulse of the input signal SIn, the second trace 1520*a* illustrates the operation of the first timer circuitry 1440-1, the third trace 1530*a* illustrates the operation of the second timer circuitry 1440-2, the fourth trace 1540*a* illustrates the modified input signal SIn' for the relatively high supply voltage $VBat_{high}$ and the fifth trace 1550*a* illustrates the PWM output signal PWMOut for the relatively high supply voltage $VBat_{high}$.

On detection of a rising edge of a pulse of the input signal SIn at time t0, the first timer circuitry 1440-1 starts timing the first time period, which, as discussed above, has a fixed duration d1 that is determined based on the reference voltage VBatRef.

Where the supply voltage is relatively high (i.e. $VBat=VBat_{high}$), the fixed duration d1 of the first time period expires at a time t1, at which point the first timer circuitry 1440-1 stops timing. Until this trigger signal is received by the logic circuitry 850, the output of the logic circuitry 850 is low, and so the modified input signal SIn' is low. The PWM output signal PWMOut is therefore low.

At time t1 the fixed duration d1 of the first time period expires and the first timer circuitry 1440-1 outputs the trigger signal to the first input of the logic circuitry 850, which in turn causes the output of the logic circuitry 850 to go high and the modified input signal SIn' also to go high. Thus the PWM output signal PWMOut is equal to (or close to) $VBat_{high}$.

At time t3 the input signal SIn goes low, and the second timer circuitry 1440-2 starts timing the second period, which, as discussed above, has a duration d2 that is based upon the value of the digital signal output by the ADC circuitry 1430, such that for a relatively high supply voltage $VBat_{high}$, the fixed duration d2 is shorter than the fixed duration for a relatively lower supply voltage $VBat_{low}$. Thus, the duration d2 of the second time period is inversely proportional to the magnitude of the supply voltage VBat.

At time t4, the duration d2 of the second time period expires and the second timer circuitry 1440-2 outputs a reset signal to the second input of the logic circuitry 850, which in turn causes the output of the logic circuitry 850 to go low and the modified input signal SIn' also to go low. Thus the PWM output signal PWMOut is equal to (or close to) 0V.

Figure 15B:
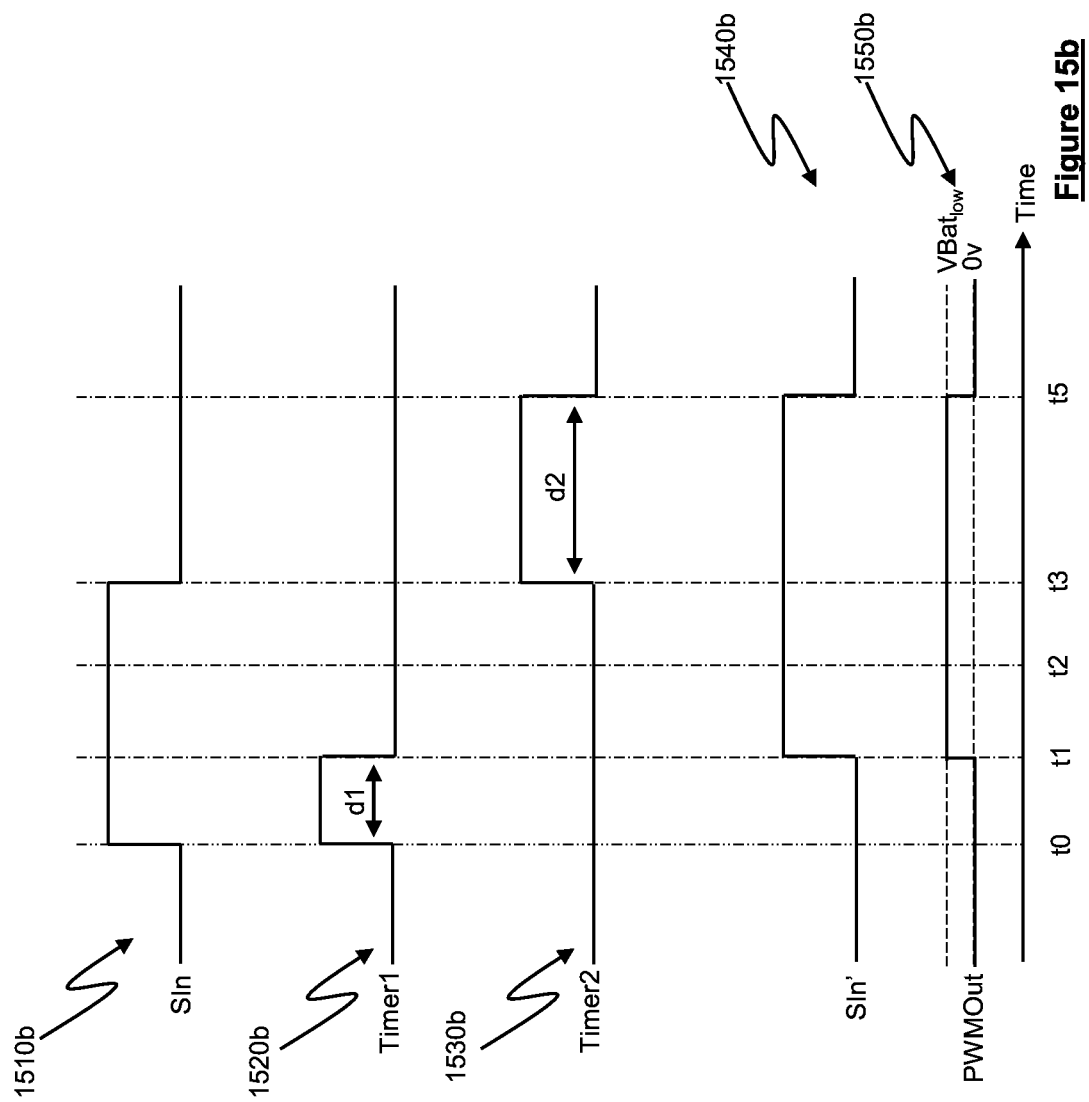

In FIG. 15*b*, the uppermost trace 1510*b* illustrates a single pulse of the input signal SIn, the second trace 1520*b* illustrates the operation of the first timer circuitry 1440-1, the third trace 1530*b* illustrates the operation of the second timer circuitry 1440-2, the fourth trace 1540*b* illustrates the modified input signal SIn' for the relatively low supply voltage $VBat_{low}$ and the fifth trace 1550*b* illustrates the PWM output signal PWMOut for the relatively low supply voltage $VBat_{low}$.

Where the supply voltage is relatively low (i.e. $VBat=VBat_{low}$), the duration d2 of the second time period of the second timer circuitry 1440-2 expires later than when the supply voltage is relatively high (i.e. $VBat=VBat_{high}$), at a time t5, at which point the second timer circuitry 1440-2 outputs the reset signal to the second input of the logic circuitry 850 to cause the modified input signal SIn' to go low and the output signal PWMOut to go low (e.g. 0v or close to 0v). Thus, when the supply voltage is relatively low, the width of the pulse of the output signal PWMOut is increased, as compared to the width of the pulse when the supply voltage is relatively high.

As will be apparent in particular from traces 1540*a*, 1540*b*, 1550*a*, 1550*b*, the monitoring circuitry 12400 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 1400 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

In common with the example described above with reference to FIGS. 12, 13*a* and 13*b*, in this example the rising edge of the output signal PWMOut is not modulated, i.e. the position in time of the rising edge of the output signal PWMOut does not change (in the example of FIGS. 14, 15*a* and 15*b* the rising edge of the output signal PWMOut always coincides with t1). Instead, the timing of the falling edge of the output signal PWMOut changes to compensate for changes in the supply voltage. Thus the length (duration) of a PWM pulse of the output signal PWMOut can be increased or decreased in order to compensate for changes in the magnitude of the supply voltage and thereby maintain a substantially constant average voltage per PWM period.

Figure 16:
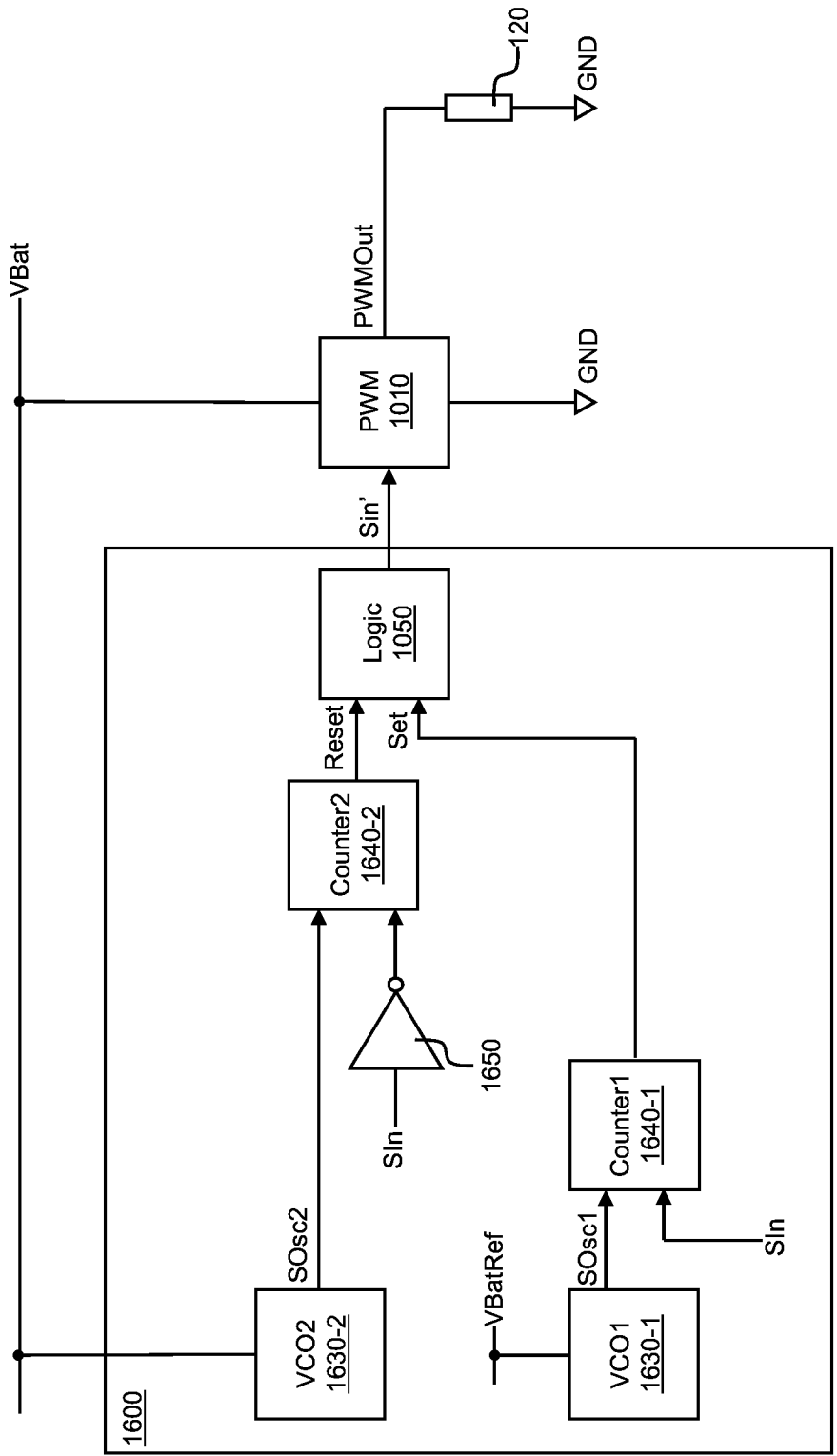
FIG. 16 is a schematic diagram illustrating further alternative example monitoring circuitry.

FIG. 16 is a schematic representation of further alternative example circuitry implementing the monitoring circuitry 320. In the example illustrated in FIG. 16 the monitoring circuitry (shown generally at 1600) is configured to generate a modified input signal SIn' and to output the modified input signal SIn' to PWM output driver circuitry 1010 to control the operation of the PWM output driver circuitry 1010.

The PWM output driver circuitry 1010 of FIG. 16 is the same as the PWM output driver circuitry 110 of FIG. 1 in construction and operation and thus will not be described in detail here.

The monitoring circuitry 1600 comprises first and second voltage controlled oscillator (VCO) circuitry 1630-1, 1630-2.

The first VCO circuitry 1630-1 is configured to receive a fixed reference voltage VBatRef and to output an oscillating signal SOsc1 having a frequency fOsc1 based on the magnitude of the fixed reference voltage VBatRef.

The second VCO circuitry 1630-2 is configured to receive the supply voltage VBat and to output an oscillating signal SOsc2 having a frequency fOsc2 which varies according to the magnitude of the supply voltage VBat. In this example the frequency fOsc2 of the oscillating signal SOsc2 is proportional to the magnitude of the supply voltage VBat, such that when the supply voltage is relatively low (i.e.

VBat=VBat$_{low}$), fOsc2 is lower than when the supply voltage is relatively high (i.e. VBat=VBat$_{high}$).

An output of the first VCO circuitry 1630-1 is coupled to a first input of first counter circuitry 1640-1. A second input of the first counter circuitry 1640-1 receives the input signal SIn. The first counter circuitry 1640-1 is configured to commence a first count of cycles of the first oscillating signal SOsc1 received at its first input on detection of a rising edge of a pulse of the input signal SIn, and to output a trigger signal to a first (set) input of the logic circuitry 1050 when the value Cnt1 of the first count reaches a count value CntRef.

An output of the second VCO circuitry 1630-2 is coupled to a first input of second counter circuitry 1640-2. A second input of the second counter circuitry 1640-2 is coupled to the output of an inverter 1650 which receives the input signal SIn, such that the second input of the second counter circuitry 1640-2 receives an inverted version of the input signal SIn. The second counter circuitry 1640-2 is configured to commence a second count of cycles of the second oscillating signal SOsc2 received at its first input on detection of a rising edge of the inverted version of the input signal SIn. Thus the second counter circuitry 1640-2 is triggered by the falling edge of a pulse of the input signal SIn. The second counter circuitry 1640-2 is configured to output a reset signal to a second (reset) input of the logic circuitry 1050 when the value Cnt2 of the second count reaches a count value CntRef.

As will be appreciated, the count value CntRef will be reached more quickly at higher values of fOsc2 than at lower values of fOsc2, and thus the count value CntRef will be reached more quickly when the magnitude of the supply voltage VBat is relatively higher.

An output of the first counter circuitry 1640-1 is coupled to a first (set) input of logic circuitry 1050. An output of the second counter circuitry 1640-2 is coupled to a second (reset) input of the logic circuitry 1050. The logic circuitry 1050 may comprise one or more flip-flops, logic gates or the like, as will be apparent to those of ordinary skill in the art, and is configured to receive a trigger signal output by the first counter circuitry 1640-1 and a reset signal output by the second counter circuitry 1640-2 and to generate a modified input signal SIn' to output to the PWM output driver circuitry 1010.

In operation of the monitoring circuitry 1600, the first VCO circuitry 1630-1 outputs the first oscillating signal SOsc1, whose frequency fOsc1 is based on or indicative of the magnitude of the reference voltage VBatRef, to the first counter circuitry 1640-1. On detection of a rising edge of a pulse of the input signal SIn the first counter circuitry 1640-1 commences counting oscillations of the first oscillating signal SOsc1 until the count value CntRef is reached, at which point the first counter circuitry 1640-1 outputs the trigger signal to the first (set) input of the logic circuitry 1050, which starts an output pulse of the modified input signal SIn'.

The second VCO circuitry 1630-2 outputs the second oscillating signal SOsc2, whose frequency fOsc2 is based on or indicative of the magnitude of the supply voltage VBat to the second counter circuitry 1640-2. On detection of a rising edge of the inverted version of the input signal SIn, the second counter circuitry 1640-2 commences counting oscillations of the second oscillating signal SOsc2 until the count value CntRef is reached, at which point the second counter circuitry 1640-2 outputs the reset signal to the second (reset) input of the logic circuitry 1050, which ends the output pulse of the modified input signal SIn'.

The operation of the monitoring circuitry 1600 will now be described with reference to the timing diagrams of FIGS. 17a and 17b.

Figure 17A:
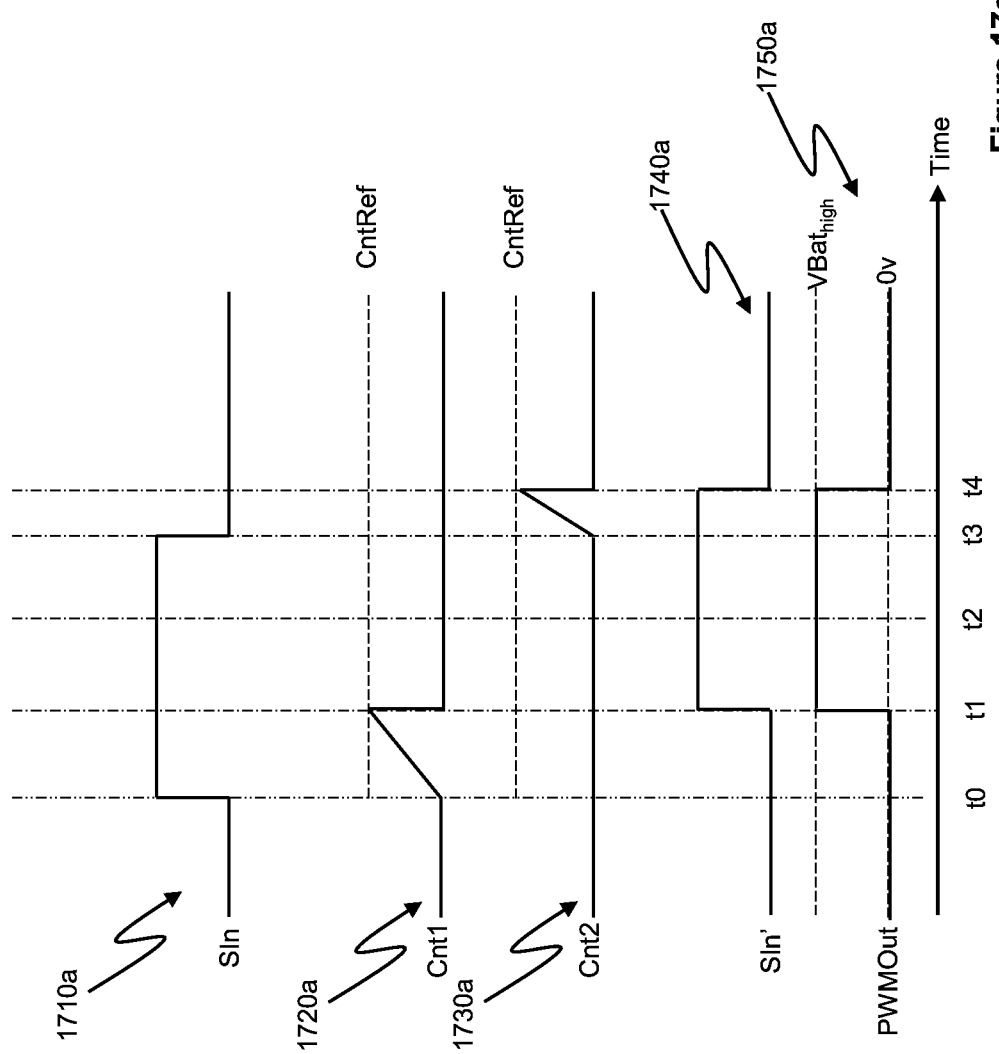
FIGS. 17a and 17b are timing diagrams illustrating the operation of the circuitry of FIG. 16.

In FIG. 17a the uppermost trace 1710a illustrates a single pulse of the input signal SIn, the second trace 1720a illustrates the first count value Cnt1, the third trace 1730a illustrates the second count value Cnt2, the fourth trace 1740a illustrates the modified input signal SIn' for the relatively high supply voltage VBat$_{high}$, and the fifth trace 1150a illustrates the PWM output signal PWMOut for the relatively high supply voltage VBat$_{high}$.

On detection of a rising edge of a pulse of the input signal SIn at time t0, the first counter circuitry 1640-1 starts counting cycles of the first oscillating signal SOsc1 output by the first VCO circuitry 1630-1.

The count value CntRef is reached at a time t1, at which point the first counter circuitry 1640-1 outputs the trigger signal to the first (set) input of the logic circuitry 1050, which in turn causes the output of the logic circuitry 1050 to go high and the modified input signal SIn' also to go high. Thus the PWM output signal PWMOut is equal to (or close to) VBat$_{high}$.

At time t3 the input signal SIn goes low, so the inverted version of the input signal goes high, thus triggering the second counter circuitry 1640-2, which starts counting cycles of the second oscillating signal SOsc2 output by the second VCO circuitry 1630-2. As discussed above, the frequency fOsc2 of the oscillating signal SOsc2 is based on the magnitude of the supply voltage VBat, such that for a relatively high supply voltage VBat$_{high}$, the frequency fOsc2 is higher than for a relatively lower supply voltage VBat$_{low}$.

Where the supply voltage is relatively high (i.e. VBat=VBat$_{high}$), the count value CntRef is reached at a time t4, at which point the second counter circuitry 1640-2 outputs the reset signal to the second (reset) input of the logic circuitry 1050. This causes the output of the logic circuitry 1050 to go low and the modified input signal SIn' also to go low, such that the output signal PWMOut also goes low.

Figure 17B:
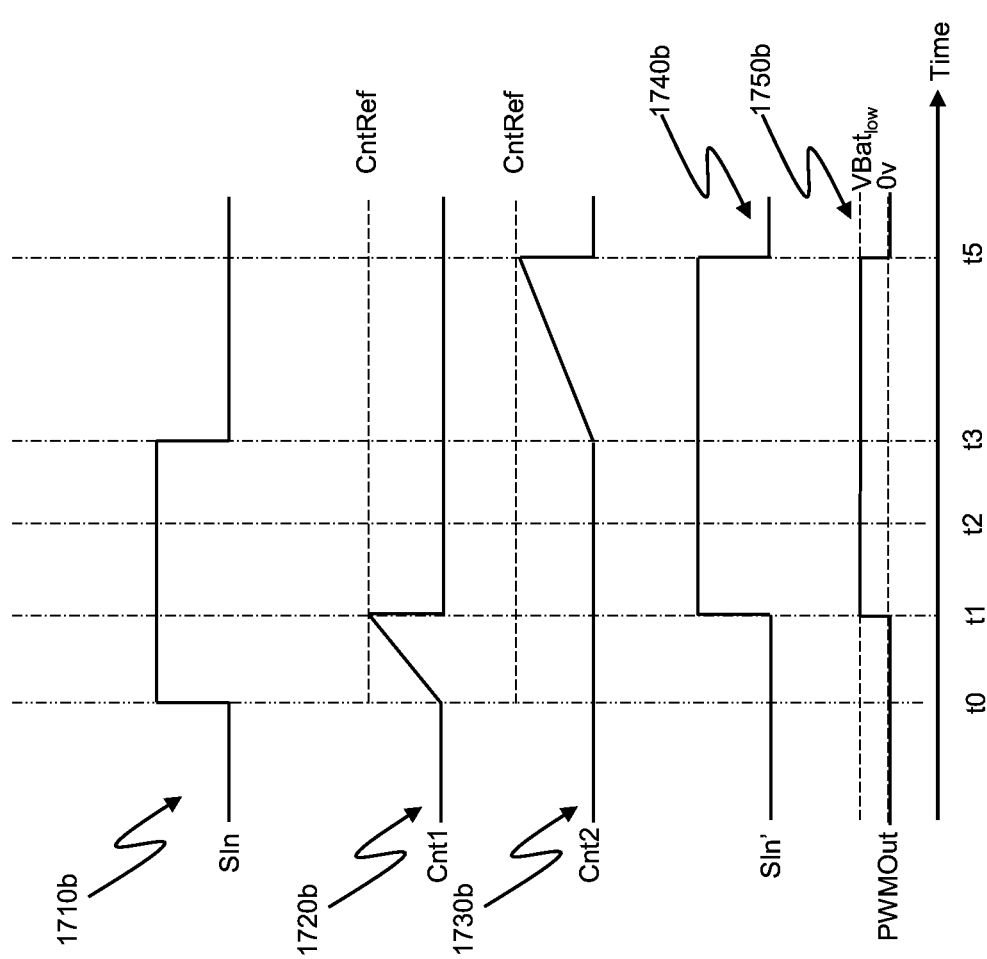

In FIG. 17b the uppermost trace 1710b illustrates a single pulse of the input signal SIn, the second trace 1720b illustrates the first count value Cnt1, the third trace 1730b illustrates the second count value Cnt2, the fourth trace 1740b illustrates the modified input signal SIn' for the relatively low supply voltage VBat$_{low}$, and the fifth trace 1150b illustrates the PWM output signal PWMOut for the relatively low supply voltage VBat$_{low}$.

On detection of a rising edge of a pulse of the input signal SIn at time t0, the first counter circuitry 1640-1 starts counting cycles of the first oscillating signal SOsc1 output by the first VCO circuitry 1630-1.

The count value CntRef is reached at a time t1, at which point the first counter circuitry 1640-1 outputs the trigger signal to the first (set) input of the logic circuitry 1050, which in turn causes the output of the logic circuitry 1050 to go high and the modified input signal SIn' also to go high. Thus the PWM output signal PWMOut is equal to (or close to) VBat$_{low}$.

At time t3 the input signal Sin goes low, so the inverted version of the input signal goes high, thus triggering the second counter circuitry 1640-2, which starts counting cycles of the second oscillating signal SOsc2 output by the second VCO circuitry 1630-2. As discussed above, the frequency fOsc2 of the oscillating signal SOsc2 is based on the magnitude of the supply voltage VBat, such that for a relatively low supply voltage VBat$_{low}$, the frequency fOsc2 is lower than for a relatively higher supply voltage VBat$_{high}$.

Where the supply voltage is relatively low (i.e. VBat=$VBat_{low}$), the count value CntRef is reached later than when the supply voltage is relatively high (i.e. VBat=$VBat_{high}$), at a time t5, at which point the second counter circuitry 1640-2 outputs the reset signal to the second (reset) input of the logic circuitry 1050. This causes the modified input signal SIn' to go low. The PWM output signal PWMOut is therefore also low.

The first count value Cnt1 may be reset to zero at an appropriate point, e.g. when it reaches CntRef (or shortly thereafter). Similarly, the second count value Cnt2 may be reset to zero at an appropriate point, e.g. when it reaches CntRef (or shortly thereafter).

As will be apparent in particular from traces 1740a, 1740b, 1750a, 1750b, the monitoring circuitry 1600 compensates for a relatively lower supply voltage $VBat_{low}$ by increasing the width (i.e. duration) of a pulse in a PWM period of the output signal PWMOut, so as to maintain a substantially constant average voltage per PWM period, despite the reduced magnitude of the supply voltage.

Similarly, the monitoring circuitry 1600 compensates for a relatively higher supply voltage $VBat_{high}$ by reducing the width (i.e. duration) of a pulse in a PWM period of the output signal PWMOut, so as to maintain a substantially constant average voltage per PWM period, despite the increased magnitude of the supply voltage.

In common with the examples described above with reference to FIGS. 12-15b, in this example the rising edge of the output signal PWMOut is not modulated, i.e. the position in time of the rising edge of the output signal PWMOut does not change. (In the example of FIGS. 16, 17a and 17b the rising edge of the output signal PWMOut always coincides with t1). Instead, the timing of the falling edge of the output signal PWMOut changes to compensate for changes in the supply voltage. Thus the length (duration) of a PWM pulse of the output signal PWMOut can be increased or decreased in order to compensate for changes in the magnitude of the supply voltage and thereby maintain a substantially constant average voltage per PWM period.

The circuitry 300 may be incorporated in a host device, which may be a battery powered device. For example, the host device may comprise a computer game controller, a virtual reality (VR) or augmented reality (AR) device such as a headset, eyewear or the like, a mobile telephone, a tablet or laptop computer or an accessory device such as headphones, earphones or a headset.

Figure 18:
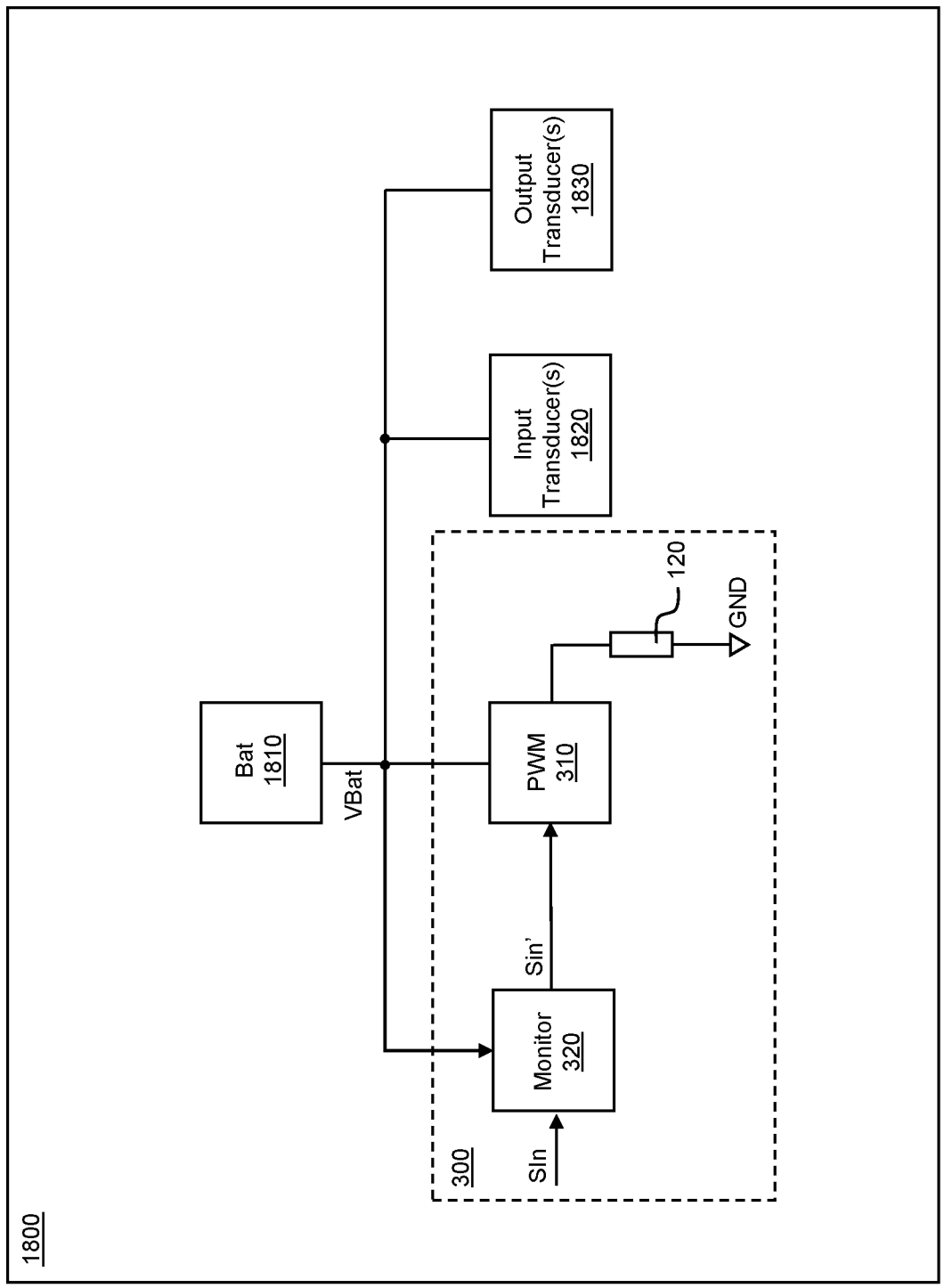
FIG. 18 is a schematic diagram illustrating a host device incorporating the circuitry of FIG. 3.

FIG. 18 is a schematic representation showing some elements of such a host device. The host device, shown generally at 1800 in FIG. 18, includes a battery 1810, a load 120, which may be, for example, an output transducer such as a motor, LED or LED array, a haptic transducer, a resonant actuator or a servo, or may alternatively be electronic circuitry such as amplifier circuitry. The load 120 is controlled by the PWM output driver circuitry 310 based on a modified input signal SIn' output by monitoring circuitry 320, as described above with reference to FIGS. 3-17.

The host device 1800 may further comprise one or more input transducers 1820 (and associated driver circuitry), which may comprise, for example, a microphone, a joystick, one or more buttons, switches, force sensors, touch sensors and/or touch screens, and one or more output transducers 1830 (and associated driver circuitry), which may comprise, for example, one or more haptic output transducers, one or more audio output transducers such as loudspeakers and one or more video output transducers such as screens, displays or the like.

As will apparent from the foregoing discussion, the circuitry of the present disclosure provides a mechanism for dynamically compensating for changes in the supply voltage applied to PWM output driver circuitry, such that the average voltage (or, equivalently, the average power) supplied to load (e.g. a transducer or electronic circuitry) driven by the PWM output driver circuitry per PWM period remains substantially constant for a required state of operation of the load, thus maintaining a consistent load output. The circuitry of the present disclosure is able to compensate for both transient changes in the available supply voltage (which may arise, for example, as a result of current being drawn from a power supply by other components or subsystems of a host device that incorporates the PWM output driver circuitry) and for longer term changes in the available supply voltage (which may arise, for example, due to discharge of a battery over time).

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry comprising:
pulse-width modulation (PWM) circuitry configured to generate a PWM output signal; and
monitoring circuitry configured to monitor a supply voltage to the PWM circuitry and to output a control signal for controlling operation of the PWM circuitry, wherein the control signal is based on the supply voltage;
wherein the monitoring circuitry is configured to receive an input signal for the PWM circuitry and to output a modified input signal to the PWM circuitry as the control signal, and wherein the PWM circuitry is configured to generate the PWM output signal based on the modified input signal, and
wherein the monitoring circuitry comprises:
analogue-to-digital converter (ADC) circuitry configured to generate a digital output signal based on the supply voltage;
timer circuitry configured to:
receive the input signal and the digital output signal;
commence timing a time period on detection of a feature of the input signal, wherein a duration of the time period is based on the digital output signal; and
output a timer output signal at the end of the time period; and
logic circuitry configured to receive the input signal and the timer output signal and to generate a modified input signal for the PWM circuitry based on the input signal and the timer output signal.

2. Circuitry according to claim 1, wherein the PWM circuitry is operative to control a pulse width of a pulse of the PWM output signal based on the control signal.

3. Circuitry according to claim 2, wherein the PWM circuitry is operative to control a pulse width of a pulse of the PWM output signal based on the control signal to maintain a given average voltage per period of the PWM output signal to compensate, at least partially, for a change in a magnitude of the supply voltage.

4. Circuitry according to claim 3, wherein the circuitry is configured to increase the pulse width of the pulse of the PWM output signal to compensate, at least partially, for a decrease in the magnitude of the supply voltage.

5. Circuitry according to claim 3, wherein the circuitry is configured to decrease the pulse width of the pulse of the PWM output signal to compensate, at least partially, for an increase in the magnitude of the supply voltage.

6. Circuitry according to claim 1, wherein the timer circuitry is configured such that the duration of the time period is inversely proportional to a magnitude of the supply voltage.

7. Circuitry according to claim 1, wherein the feature of the input signal is a rising edge of a pulse of the input signal.

8. Integrated circuitry comprising the circuitry of claim 1.

9. A system comprising the circuitry of claim 1, and an output transducer configured to receive the PWM output signal from the PWM circuitry.

10. A system according to claim 9, wherein the output transducer comprises one or more of a motor, a light emitting diode (LED) or LED array, a haptic actuator, a resonant actuator and/or a servo.

11. A device comprising the circuitry of claim 1, wherein the device comprises a battery powered device, a computer game controller, a virtual reality (VR) or augmented reality (AR) device, eyewear, a mobile telephone, a tablet or laptop computer, an accessory device, headphones, earphones or a headset.

12. Circuitry comprising:
pulse-width modulation (PWM) circuitry configured to generate a PWM output signal; and monitoring circuitry configured to monitor a supply voltage to the PWM circuitry and to output a control signal for controlling operation of the PWM circuitry, wherein the control signal is based on the supply voltage;

wherein the monitoring circuitry is configured to receive an input signal for the PWM circuitry and to output a modified input signal to the PWM circuitry as the control signal, and wherein the PWM circuitry is configured to generate the PWM output signal based on the modified input signal;

wherein the monitoring circuitry comprises:
waveform generator circuitry configured to generate a voltage having an amplitude that changes over time based on a magnitude of the supply voltage;
comparator circuitry configured to compare the voltage to a reference voltage and to output a comparison signal when the voltage reaches the reference voltage; and
logic circuitry configured to receive the input signal and the comparison signal and to generate a modified input signal for the PWM circuitry based on the input signal and the comparison signal;
wherein the waveform generator circuitry is configured such that a rate of increase of the voltage is inversely proportional to the magnitude of the supply voltage.

13. Circuitry according to claim 12, wherein the waveform generator circuitry is configured to generate a ramp voltage.

14. Circuitry comprising:
pulse-width modulation (PWM) circuitry configured to generate a PWM output signal; and
monitoring circuitry configured to monitor a supply voltage to the PWM circuitry and to output a control signal for controlling operation of the PWM circuitry, wherein the control signal is based on the supply voltage;

wherein the monitoring circuitry is configured to receive an input signal for the PWM circuitry and to output a modified input signal to the PWM circuitry as the control signal, and wherein the PWM circuitry is configured to generate the PWM output signal based on the modified input signal;

wherein the monitoring circuitry comprises:
waveform generator circuitry configured to generate a voltage having an amplitude that changes over time based on a magnitude of the supply voltage;
comparator circuitry configured to compare the voltage to a reference voltage and to output a comparison signal when the voltage reaches the reference voltage; and
logic circuitry configured to receive the input signal and the comparison signal and to generate a modified input signal for the PWM circuitry based on the input signal and the comparison signal;

wherein the waveform generator circuitry comprises:
a capacitor;
voltage-to-current converter circuitry configured to generate a first current based on the supply voltage;
current generator circuitry configured to generate a constant current for charging the capacitor; and
current mirror circuitry; and
a current control transistor, wherein the current mirror circuitry is configured to mirror the first current to a control terminal of the current control transistor, such that the current control transistor controls a portion of the constant current that is diverted away from the capacitor.

15. Circuitry comprising:
pulse-width modulation (PWM) circuitry configured to generate a PWM output signal; and
monitoring circuitry configured to monitor a supply voltage to the PWM circuitry and to output a control signal for controlling operation of the PWM circuitry, wherein the control signal is based on the supply voltage;

wherein the monitoring circuitry is configured to receive an input signal for the PWM circuitry and to output a modified input signal to the PWM circuitry as the control signal, and wherein the PWM circuitry is configured to generate the PWM output signal based on the modified input signal;

wherein the monitoring circuitry comprises:
voltage controlled oscillator (VCO) circuitry configured to generate an oscillating output signal having a frequency that is based on the supply voltage;
counter circuitry configured to:
receive the input signal and the oscillating output signal;
commence a count of cycles of the oscillating signal on detection of a feature of the input signal; and
output a counter output signal when the count reaches a count value that represents a magnitude of the supply voltage; and
logic circuitry configured to receive the input signal and the counter output signal and to generate a modified input signal for the PWM circuitry based on the input signal and the counter output signal.

16. Circuitry according to claim 15, wherein the VCO circuitry is configured such that the frequency of the oscillating output signal is inversely proportional to the magnitude of the supply voltage.

17. Circuitry according to claim 15, wherein the feature of the input signal is a rising edge of a pulse of the input signal.

18. Circuitry comprising:
pulse-width modulation (PWM) circuitry configured to generate a PWM output signal; and
monitoring circuitry configured to monitor a supply voltage to the PWM circuitry and to output a control signal for controlling operation of the PWM circuitry, wherein the control signal is based on the supply voltage;

wherein the monitoring circuitry is configured to receive an input signal for the PWM circuitry and to output a modified input signal to the PWM circuitry as the control signal, and wherein the PWM circuitry is configured to generate the PWM output signal based on the modified input signal;

wherein the monitoring circuitry comprises:
first waveform generator circuitry configured to generate a first voltage having an amplitude that changes over time based on a first fixed reference voltage;
second waveform generator circuitry configured to generate a second voltage having an amplitude that changes over time based on a magnitude of the supply voltage;
first comparator circuitry configured to compare the first voltage to a second reference voltage and to output a first comparison signal when the first voltage reaches the second reference voltage;
second comparator circuitry configured to compare the second voltage to the second reference voltage and to output a second comparison signal when the second voltage reaches the second reference voltage; and
logic circuitry configured to receive the first and second comparison signals and to generate a modified input signal for the PWM circuitry based on the first and second comparison signals.

19. Circuitry comprising:
pulse-width modulation (PWM) circuitry configured to generate a PWM output signal; and
monitoring circuitry configured to monitor a supply voltage to the PWM circuitry and to output a control signal for controlling operation of the PWM circuitry, wherein the control signal is based on the supply voltage;
wherein the monitoring circuitry is configured to receive an input signal for the PWM circuitry and to output a modified input signal to the PWM circuitry as the control signal, and wherein the PWM circuitry is configured to generate the PWM output signal based on the modified input signal;
wherein the monitoring circuitry comprises:
first timer circuitry configured to:
receive the input signal and a reference signal;
commence timing a first time period on detection of a feature of the input signal, wherein a duration of the time period is based on the reference signal; and
output a first timer output signal at the end of the first time period;
analogue-to-digital converter (ADC) circuitry configured to generate a digital output signal based on the supply voltage;
second timer circuitry having a first input configured to receive an inverted version of the input signal and a second input coupled to an output of the ADC circuitry, the second timer circuitry configured to:
commence timing a second time period on detection of signal feature of the inverted input signal, wherein a duration of the second time period is based on the digital output signal; and
output a second timer output signal at the end of the second time period; and
logic circuitry configured to receive the first and second timer output signals and to generate a modified input signal for the PWM circuitry based on the first and second timer output signals.

20. Circuitry comprising:
pulse-width modulation (PWM) circuitry configured to generate a PWM output signal; and
monitoring circuitry configured to monitor a supply voltage to the PWM circuitry and to output a control signal for controlling operation of the PWM circuitry, wherein the control signal is based on the supply voltage;
wherein the monitoring circuitry is configured to receive an input signal for the PWM circuitry and to output a modified input signal to the PWM circuitry as the control signal, and wherein the PWM circuitry is configured to generate the PWM output signal based on the modified input signal;
wherein the monitoring circuitry comprises:
first voltage controlled oscillator (VCO) circuitry configured to generate a first oscillating output signal having a frequency that is based on a reference voltage;
second voltage controlled oscillator (VCO) circuitry configured to generate a second oscillating output signal having a frequency that is based on the supply voltage;
first counter circuitry configured to:
receive the input signal and the first oscillating output signal;
commence a count of cycles of the first oscillating signal on detection of a feature of the input signal; and
output a first counter output signal when the count reaches a reference count value;
second counter circuitry configured to:
receive an inverted version of the input signal and the second oscillating output signal;
commence a count of cycles of the first oscillating signal on detection of signal feature of the inverted version of the input signal; and
output a second counter output signal when the count reaches the reference count value; and
logic circuitry configured to receive the first and second counter outputs signal and to generate a modified input signal for the PWM circuitry based on the first and second counter output signals.

21. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:
analogue-to-digital converter (ADC) circuitry configured to generate a digital output signal based on the supply voltage;
timer circuitry configured to:
receive the input signal and the digital output signal;
commence timing a time period on detection of a feature of the input signal, wherein a duration of the time period is based on the digital output signal; and
output a timer output signal at the end of the time period; and
logic circuitry configured to receive the input signal and the timer output signal and to generate a modified input signal for the PWM circuitry based on the input signal and the timer output signal.

22. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:
waveform generator circuitry configured to generate a voltage having an amplitude that changes over time based on a magnitude of the supply voltage;
comparator circuitry configured to compare the voltage to a reference voltage and to output a comparison signal when the voltage reaches the reference voltage; and
logic circuitry configured to receive the input signal and the comparison signal and to generate a modified input signal for the PWM circuitry based on the input signal and the comparison signal,
wherein the waveform generator circuitry is configured such that a rate of increase of the voltage is inversely proportional to the magnitude of the supply voltage.

23. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:
waveform generator circuitry configured to generate a voltage having an amplitude that changes over time based on a magnitude of the supply voltage;

comparator circuitry configured to compare the voltage to a reference voltage and to output a comparison signal when the voltage reaches the reference voltage; and logic circuitry configured to receive the input signal and the comparison signal and to generate a modified input signal for the PWM circuitry based on the input signal and the comparison signal, wherein the waveform generator circuitry comprises:
　a capacitor;
　voltage-to-current converter circuitry configured to generate a first current based on the supply voltage;
　current generator circuitry configured to generate a constant current for charging the capacitor;
　current mirror circuitry; and
　a current control transistor, wherein the current mirror circuitry is configured to mirror the first current to a control terminal of the current control transistor, such that the current control transistor controls a portion of the constant current that is diverted away from the capacitor.

24. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:

voltage controlled oscillator (VCO) circuitry configured to generate an oscillating output signal having a frequency that is based on the supply voltage;
　counter circuitry configured to:
　　receive the input signal and the oscillating output signal;
　　commence a count of cycles of the oscillating signal on detection of a feature of the input signal; and
　　output a counter output signal when the count reaches a count value that represents a magnitude of the supply voltage; and
　logic circuitry configured to receive the input signal and the counter output signal and to generate a modified input signal for the PWM circuitry based on the input signal and the counter output signal.

25. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:

first waveform generator circuitry configured to generate a first voltage having an amplitude that changes over time based on a first fixed reference voltage;
　second waveform generator circuitry configured to generate a second voltage having an amplitude that changes over time based on a magnitude of the supply voltage;
　first comparator circuitry configured to compare the first voltage to a second reference voltage and to output a first comparison signal when the first voltage reaches the second reference voltage;
　second comparator circuitry configured to compare the second voltage to the second reference voltage and to output a second comparison signal when the second voltage reaches the second reference voltage; and
　logic circuitry configured to receive the first and second comparison signals and to generate a modified input signal for the PWM circuitry based on the first and second comparison signals.

26. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:

first timer circuitry configured to:
　　receive the input signal and a reference signal;
　　commence timing a first time period on detection of a feature of the input signal, wherein a duration of the time period is based on the reference signal; and
　　output a first timer output signal at the end of the first time period;
　analogue-to-digital converter (ADC) circuitry configured to generate a digital output signal based on the supply voltage;
　second timer circuitry having a first input configured to receive an inverted version of the input signal and a second input coupled to an output of the ADC circuitry, the second timer circuitry configured to:
　　commence timing a second time period on detection of signal feature of the inverted input signal, wherein a duration of the second time period is based on the digital output signal; and
　　output a second timer output signal at the end of the second time period; and
　logic circuitry configured to receive the first and second timer output signals and to generate a modified input signal for the PWM circuitry based on the first and second timer output signals.

27. Monitoring circuitry configured to receive a supply voltage applied to pulse-width modulation (PWM) circuitry and an input signal for the PWM circuitry, the monitoring circuitry configured to generate a modified input signal for the PWM circuitry based on the input signal and the supply voltage, wherein the monitoring circuitry comprises:

first voltage controlled oscillator (VCO) circuitry configured to generate a first oscillating output signal having a frequency that is based on a reference voltage;
　second voltage controlled oscillator (VCO) circuitry configured to generate a second oscillating output signal having a frequency that is based on the supply voltage;
　first counter circuitry configured to:
　　receive the input signal and the first oscillating output signal;
　　commence a count of cycles of the first oscillating signal on detection of a feature of the input signal; and
　　output a first counter output signal when the count reaches a reference count value;
　second counter circuitry configured to:
　　receive an inverted version of the input signal and the second oscillating output signal;
　　commence a count of cycles of the first oscillating signal on detection of signal feature of the inverted version of the input signal; and
　　output a second counter output signal when the count reaches the reference count value; and
　logic circuitry configured to receive the first and second counter outputs signal and to generate a modified input signal for the PWM circuitry based on the first and second counter output signals.

* * * * *